(12) United States Patent
Fukui et al.

(10) Patent No.: US 10,839,977 B2
(45) Date of Patent: Nov. 17, 2020

(54) CONDUCTIVE FIBER-COATED PARTICLE, CURABLE COMPOSITION AND CURED ARTICLE DERIVED FROM CURABLE COMPOSITION

(71) Applicant: DAICEL CORPORATION, Osaka (JP)

(72) Inventors: Kazuhisa Fukui, Himeji (JP); Mami Sakurai, Himeji (JP)

(73) Assignee: DAICEL CORPORATION, Osaka (JP)

( * ) Notice: Subject to any disclaimer, the term of this patent is extended or adjusted under 35 U.S.C. 154(b) by 145 days.

(21) Appl. No.: 14/417,050

(22) PCT Filed: Jul. 23, 2013

(86) PCT No.: PCT/JP2013/070405
§ 371 (c)(1),
(2) Date: Jan. 23, 2015

(87) PCT Pub. No.: WO2014/017658
PCT Pub. Date: Jan. 30, 2014

(65) Prior Publication Data
US 2015/0206619 A1    Jul. 23, 2015

(30) Foreign Application Priority Data

Jul. 24, 2012  (JP) ................................ 2012-163941
Jul. 24, 2012  (JP) ................................ 2012-163994
Dec. 5, 2012   (JP) ................................ 2012-266010
Dec. 28, 2012  (JP) ................................ 2012-286595

(51) Int. Cl.
| | | |
|---|---|---|
| H01B 1/00 | (2006.01) | |
| H01B 1/20 | (2006.01) | |
| C09J 9/00 | (2006.01) | |
| B82Y 30/00 | (2011.01) | |
| H01B 1/22 | (2006.01) | |
| H01B 1/02 | (2006.01) | |
| H01B 1/24 | (2006.01) | |
| B22F 1/00 | (2006.01) | |
| C08L 63/00 | (2006.01) | |
| C09J 9/02 | (2006.01) | |
| H05K 1/02 | (2006.01) | |
| B82Y 40/00 | (2011.01) | |

(52) U.S. Cl.
CPC ............ *H01B 1/22* (2013.01); *B22F 1/0025* (2013.01); *B82Y 30/00* (2013.01); *C08L 63/00* (2013.01); *C09J 9/02* (2013.01); *H01B 1/02* (2013.01); *H01B 1/24* (2013.01); *H05K 1/0284* (2013.01); *B22F 2999/00* (2013.01); *B82Y 40/00* (2013.01)

(58) Field of Classification Search
CPC ... H01B 1/22; H01B 1/02; H01B 1/24; H01B 1/00; H01B 1/14; H01B 1/20; B22F 1/0025; B22F 2999/00; B82Y 30/00; B82Y 40/00; C08L 63/00; C09J 9/02; H05K 1/0284
USPC ......................................................... 252/500
See application file for complete search history.

(56) References Cited

U.S. PATENT DOCUMENTS

| | | | |
|---|---|---|---|
| 8,198,796 B2 | 6/2012 | Takada | |
| 2011/0018424 A1* | 1/2011 | Takada ............. | H01L 31/02246 313/352 |

FOREIGN PATENT DOCUMENTS

| | | | |
|---|---|---|---|
| JP | 62-188184 A | | 8/1987 |
| JP | 09-185069 A | | 7/1997 |
| JP | 10-226773 A | | 8/1998 |
| JP | 2000-251536 A | | 9/2000 |
| JP | 3241276 B2 | | 12/2001 |
| JP | 2002-158051 A | | 5/2002 |
| JP | 62-250942 A | | 5/2004 |
| JP | 2004-149903 A | | 5/2004 |
| JP | 2005-63979 A | | 3/2005 |
| JP | 2006-54066 A | | 2/2006 |
| JP | 2006054066 A | * | 2/2006 |
| JP | 2011-60432 A | | 3/2011 |
| JP | 2011060432 A | * | 3/2011 |
| JP | 2013-77427 A | | 4/2013 |
| KR | 20120122533 A | * | 11/2012 |
| WO | WO 2010/010838 A1 | | 1/2010 |

OTHER PUBLICATIONS

Effect of silver nanowires on electrical conductance of system composed of silver particles, Chen et al., J Mater Sci (2007) 42:3172-3176.*
Machine translation of JP2002054066.*
KR20120122533 translation.*
Dimorphic magnetorheological fluids: exploiting partial substitution of microspheres by nanowires, Ngatu et al., Smart Mater. Struct. 17 (2008) 045022.*

(Continued)

*Primary Examiner* — Haidung D Nguyen
(74) *Attorney, Agent, or Firm* — Birch, Stewart, Kolasch & Birch, LLP

(57) ABSTRACT

Provided is a fine conductive particle that can be produced by a simple method, can impart excellent conductivity (in particular, conductivity in the thickness direction) to a cured article when incorporated in a small amount into the cured article, and allows the cured article to exhibit excellent transparency and conductivity.
The conductive fiber-coated particle includes a particulate substance and a fibrous conductive substance. The particulate substance is coated with the fibrous conductive substance. In the conductive fiber-coated particle, the fibrous conductive substance preferably includes a conductive nanowire. More preferably, the conductive nanowire preferably includes at least one selected from the group consisting of metal nanowires, semiconductor nanowires, carbon fibers, carbon nanotubes, and conductive polymer nanowires.

28 Claims, 4 Drawing Sheets

(56) References Cited

OTHER PUBLICATIONS

Aligned ZnO Nanorod Arrays Grown Directly on Zinc Foils and Zinc Spheres by a Low-Temperature Oxidization Method, Gu et al., ACSNano, vol. 3, No. 2, 273-278, 2009, 273-278.*
Biomimetic Nanowire Coatings for Next Generation Adhesive Drug Delivery Systems, Fischer et al, Nano Lett., vol. 9, No. 2, 2009, 716-720.*
International Search Report, dated Sep. 3, 2013, issued in PCT/JP2013/070405.
Japanese Office Action, dated Nov. 22, 2016, for counterpart Japanese Application No. 2014-527041, with an English translation.
Korean Office Action, dated May 29, 2019, for counterpart Korean Application No. 10-2015-7003231, with an English translation.

* cited by examiner

[Fig. 1]
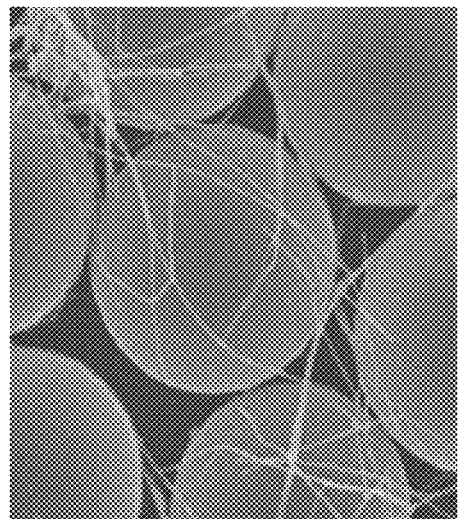
[Fig. 2]
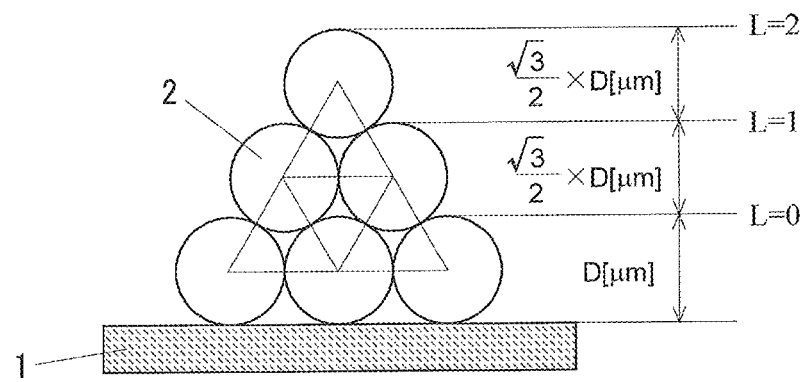

[Fig. 3]
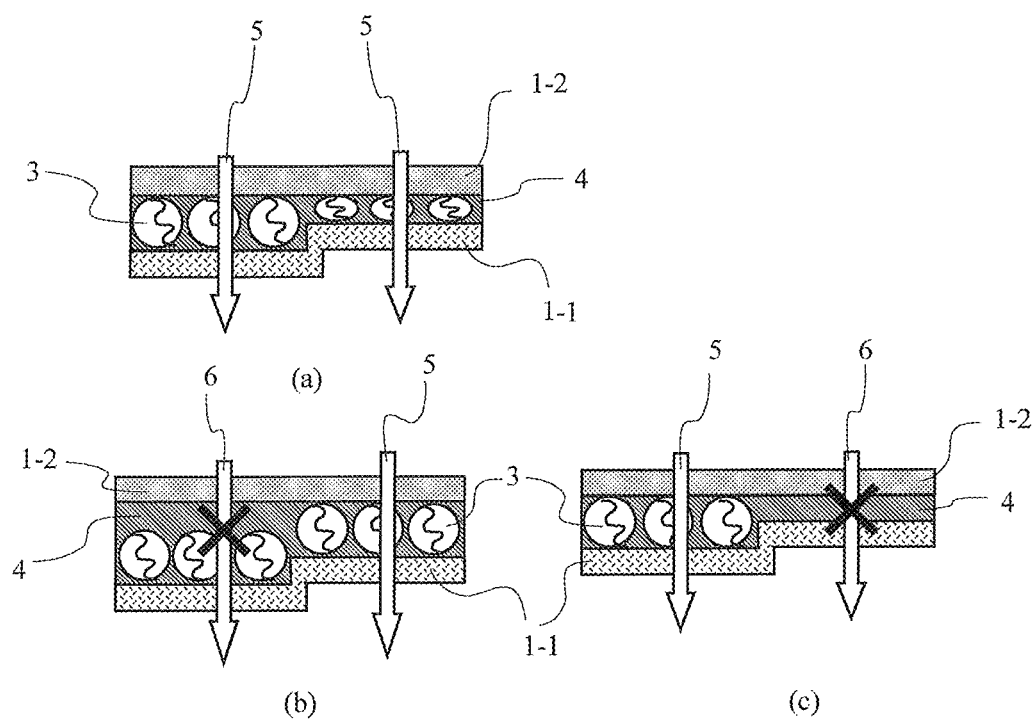
[Fig. 4]
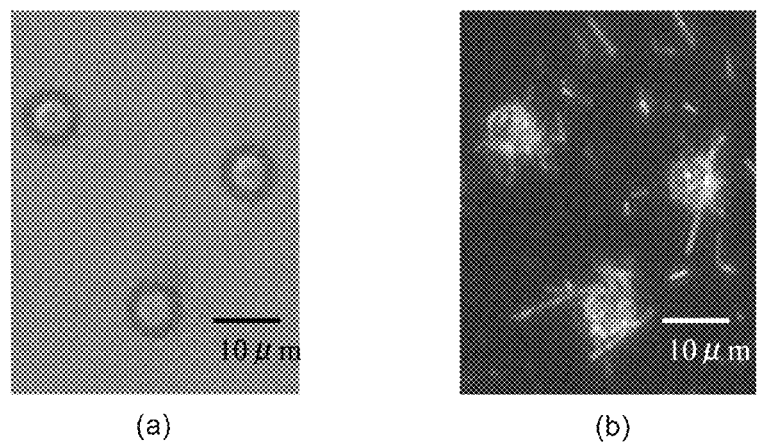

[Fig. 5]
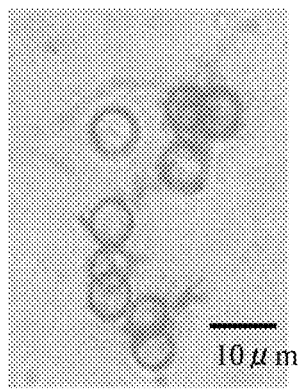 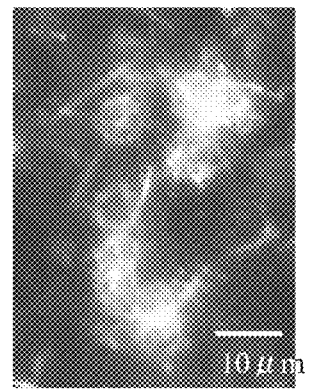
(a)            (b)
[Fig. 6]
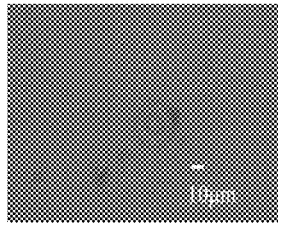
[Fig. 7]
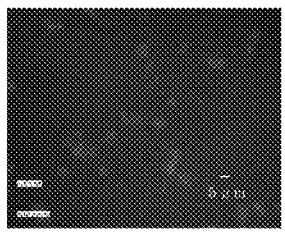

[Fig. 8]
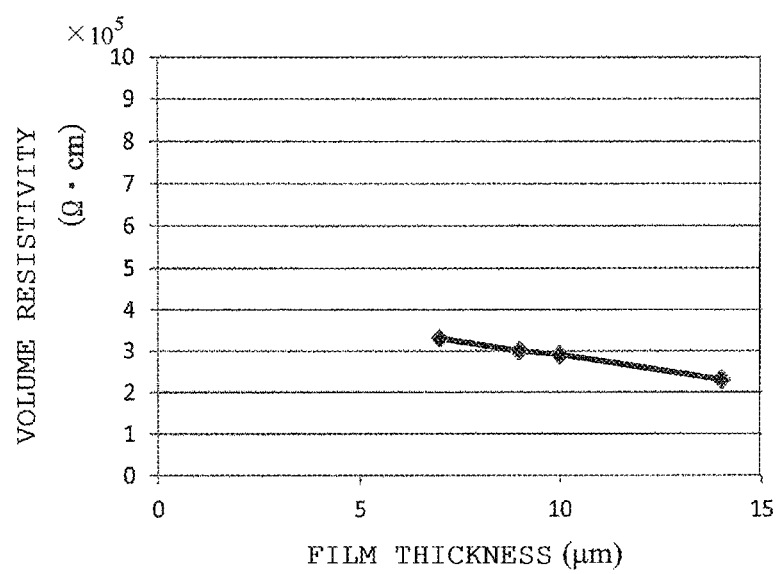

CONDUCTIVE FIBER-COATED PARTICLE, CURABLE COMPOSITION AND CURED ARTICLE DERIVED FROM CURABLE COMPOSITION

TECHNICAL FIELD

The present invention relates to conductive fiber-coated particles each including a particulate substance and a fibrous conductive substance; curable compositions including the conductive fiber-coated particles; and cured articles derived from the curable compositions.

BACKGROUND ART

Fine particles having conductivity (fine conductive particles) are used typically for coupling of fine electrodes in electrical and electronic appliances. Examples of the fine conductive particles include fine conductive particles prepared by applying a metal onto fine resinous particles (see Patent Literature (PTL) 1). The fine conductive particles are used to impart conductivity to a resinous cured article by blending them with an insulating curable compound (e.g., thermosetting compound) and curing the resulting mixture (see PTLs 2, 3, and 4).

CITATION LIST

Patent Literature

PTL 1: Japanese Patent No. 3241276
PTL 2: Japanese Unexamined Patent Application Publication (JP-A) No. 2000-251536
PTL 3: JP-A No. S62-188184
PTL 4: JP-A No. H10-226773

SUMMARY OF INVENTION

Technical Problem

Disadvantageously, however, the fine conductive particles each include the metal covering the entire surface of the fine resinous particles, thereby require a large amount of an expensive metal material, and suffer from high material cost. Also disadvantageously, the fine conductive particles should be produced by a special method such as electrolytic coating or alternate adsorption, thereby require a special apparatus and/or a large number of processes (steps), and suffer from high production cost.

The metal-coated resin particles are colored because of being coated with the metal on the entire surface. In addition, the metal-coated resin particles should be incorporated or blended in a large amount to allow the metal-coated resin particles as fine conductive particles to be in contact with each other in the resinous cured article so as to impart conductivity to the resinous cured article. This impedes inexpensive preparation of a cured article having both transparency and conductivity.

Separately, a technique is known to impart conductivity to a resinous cured article. This technique includes mixing metal nanowires with a resin to give a metal-nanowire-mixed resin. The metal-nanowire-mixed resin is applied in the form of a thin film (thin layer) and cured. This process is repeated to orient the metal nanowires. Unfortunately, however, this technique requires repetition of the operation of applying the metal-nanowire-mixed resin (solution) and curing the applied resin several tens to several hundreds of times and suffers from complicated processes and poor productivity. In addition, there is a need for a large amount of the metal nanowires to ensure conductivity. These also impede inexpensive preparation of a transparent cured article.

Possible solutions to impart conductivity to a resinous cured article while maintaining its transparency include a technique of applying a conductive ink onto a resinous cured article; and a technique of forming a metal line (metal wiring). These techniques can impart conductivity to a resinous cured article while ensuring its transparency. However, they can impart conductivity in the in-plane direction alone to the resinous cured article surface and fail to allow the resinous cured article to develop conductivity in the thickness direction thereof.

Accordingly, it is a first object of the present invention to provide a fine conductive particle (conductive fiber-coated particle) as follows. The fine conductive particle can be produced by a simple method and can give a cured article with excellent conductivity (in particular, conductivity in the thickness direction) when incorporated in a small amount into the cured article. The resulting cured article excels both in transparency and conductivity.

It is a second object of the present invention to provide a curable composition that can inexpensively give a cured article excellent both in transparency and conductivity (in particular, conductivity in the thickness direction).

It is a third object of the present invention to provide a fine conductive particle (conductive fiber-coated particle) as follows. The fine conductive particle can be produced by a simple method, has such flexibility as to conform to a fine three-dimensional shape by pressurization (compression), and, when incorporated into a cured article, can impart excellent conductivity (in particular, conductivity in the thickness direction) to the cured article without impairing transparency thereof.

It is a fourth object of the present invention to provide a curable composition that can inexpensively give a cured article having excellent transparency and conductivity (in particular, conductivity in the thickness direction) and exhibiting excellent conductive performance even when having a microbumped shape (shape with microbumps or fine asperities).

It is a fifth object of the present invention to provide a thin-film molded article that can be produced by a simple method and exhibits transparency and conductivity both at satisfactory levels.

As used herein the term (having) "excellent conductive performance" refers to that an article in question is devoid of poorly conducting portions and exhibits excellent conductivity entirely.

Solution to Problem

After intensive investigations, the present inventors have found findings 1 to 4 as follows. Specifically:

1. Mixing of a particulate substance with a fibrous conductive substance simply and inexpensively gives a conductive fiber-coated particle.

2. The conductive fiber-coated particle, when incorporated in a small amount into a cured article, can impart conductivity to the cured article and can thereby impart excellent conductivity (in particular, conductivity in the thickness direction) to the cured article without impairing transparency thereof.

3. Assume that the conductive fiber-coated particle is combined with a curable compound to form a curable composition, and the curable composition is cured to give a thin-film molded article. Further assume that the average particle diameter of the particulate substance constituting the conductive fiber-coated particle and the thickness of the molded article are controlled within a specific range. This allows the molded article to exhibit such anisotropic conductivity as to exhibit conductivity selectively in the thickness direction.

4. Assume that the conductive fiber-coated particle is imparted with such flexibility as to conform to a three-dimensional shape; and that the conductive fiber-coated particle is incorporated into a curable composition, and the curable composition is formed or molded into a microbumped shape (shape with microbumps). In this case, the conductive fiber-coated particle conforms to and deform along the bumped structure and extends even into fine portions of the structure. This can prevent the formation of a poorly conducting portion and gives a cured article having excellent conductive performance.

The present invention has been made based on these findings.

Specifically, the present invention provides, in one aspect, a conductive fiber-coated particle including a particulate substance and a fibrous conductive substance. The particulate substance is coated with the fibrous conductive substance.

The fibrous conductive substance in the conductive fiber-coated particle may include a conductive nanowire.

The conductive nanowire may include at least one nanowire selected from the group consisting of metal nanowires, semiconductor nanowires, carbon fibers, carbon nanotubes, and conductive polymer nanowires.

The conductive nanowire may include a silver nanowire as the metal nanowire.

The conductive nanowire may include, as the conductive polymer nanowire, a nanowire including a polymer and a dopant for the polymer, where the polymer includes at least one polymer selected from the group consisting of polyacetylenes, polyanilines and derivatives thereof, polypyrroles and derivatives thereof, and polythiophenes and derivatives thereof.

The fibrous conductive substance may have an average diameter of from 1 to 400 nm and an average length of from 1 to 100 µm.

The particulate substance may include a globular or rod-like particulate substance.

The particulate substance may have an average particle diameter of from 0.1 to 100 µm.

The particulate substance may have a 10% compressive strength of 3 kgf/mm$^2$ or less.

The conductive fiber-coated particle may be prepared by mixing the particulate substance with the fibrous conductive substance in a solvent.

The present invention further provides, in another aspect, a method for producing a conductive fiber-coated particle. The conductive fiber-coated particle includes a particulate substance and a fibrous conductive substance. The particulate substance is coated with the fibrous conductive substance. The method includes the step of mixing the particulate substance with the fibrous conductive substance in a solvent.

The present invention also provides, in yet another aspect, a curable composition including the conductive fiber-coated particle and a curable compound.

The curable composition may further include a conductive substance other than the conductive fiber-coated particle.

The conductive substance other than the conductive fiber-coated particle may include a fibrous conductive substance.

The curable composition may be curable by the application of an active energy ray and/or heat to give a cured article.

The particulate substance in the conductive fiber-coated particle may include a thermoplastic resin having a melting point equal to or lower than the curing temperature of the curable compound, and the curable composition may be cured by heating to give a cured article.

The curable composition may contain the conductive fiber-coated particle in an amount of from 0.01 to 30 parts by weight per 100 parts by weight of the curable compound.

The curable composition may contain the conductive substance other than the conductive fiber-coated particle in a content of from 0 to 10 parts by weight per 100 parts by weight of the conductive fiber-coated particle.

The curable composition may contain the particulate substance in an amount of from 0.09 to 6 parts by weight per 100 parts by weight of the curable compound.

The curable composition may contain the fibrous conductive substance in an amount of from 0.01 to 1 part by weight per 100 parts by weight of the curable compound.

The curable composition may have a difference in refractive index between the particulate substance and the curable compound of 10% or less of the refractive index of the curable compound.

The present invention further provides, in still another aspect, a method for producing the curable composition. The method includes the step of mixing the conductive fiber-coated particle with the curable compound.

In the method for producing the curable composition, the conductive fiber-coated particle to be mixed with the curable compound may be prepared through steps A and B.

In the step A, the particulate substance is mixed with the fibrous conductive substance in a solvent to give a dispersion of the conductive fiber-coated particle.

In the step B, the solvent is removed from the dispersion of the conductive fiber-coated particle prepared in the step A to give the conductive fiber-coated particle.

The present invention also provides, in another aspect, a conductive adhesive including the curable composition.

The present invention provides, in yet another aspect, a conductive encapsulating agent including the curable composition.

The present invention provides, in still another aspect, a cured article derived from the curable composition.

The cured article may have a total luminous transmittance [for a thickness of 0.1 mm] of 80% or more in a visible wavelength region.

The present invention further provides, in another aspect, a thin-film molded article including the cured article.

In the thin-film molded article, when the particulate substance constituting the conductive fiber-coated particle contained in the curable composition to form the cured article has an average particle diameter D [µm], and the molded article has a thickness T [µm], D and T may meet a condition specified by Formula (I):

$$(0.865L+1)D-0.3D \leq T(0.865L+1)D+0.3D \qquad (I)$$

where L represents an integer of 0 or more.

The thin-film molded article may have a resistance of from 0.10 to 100 kΩ in the thickness direction (cross-plane direction) and a resistance of 1 MΩ or more in the in-plane direction.

The present invention also provides, in another aspect, a transparent anisotropic conductive film including the molded article.

The present invention further provides a conductive structure including a first conductive substrate, a second conductive substrate, and the cured article. The cured article is disposed between the first and second conductive substrates. The first conductive substrate includes a bumped surface. The bumped surface faces and is bonded to one surface of the second conductive substrate through the cured article.

In addition and advantageously, the present invention provides an electronic device formed with at least one selected from the group consisting of the conductive adhesive, the conductive encapsulating agent, and the thin-film molded article.

Advantageous Effects of Invention

The conductive fiber-coated particle according to the present invention has the configuration and, when incorporated into a cured article even in a small amount, can impart excellent conductivity (in particular, conductivity in the thickness direction) to the cured article. The conductive fiber-coated particle, when incorporated into a transparent cured article, can impart excellent conductivity (in particular, conductivity in the thickness direction) to the cured article while maintaining transparency of the cured article. The conductive fiber-coated particle according to the present invention can be produced by a simple process (step) without using a special apparatus, still does not require a large amount of an expensive conductive material (material having conductivity) as a raw material, and can be inexpensively provided with the reduction in material cost. The conductive fiber-coated particle according to the present invention has all the advantageous effects. Assume that the conductive fiber-coated particle is incorporated into a curable composition, and the curable composition is cured. This can inexpensively give a cured article that has both transparency and conductivity (in particular, conductivity in the thickness direction).

Of the conductive fiber-coated particles according to embodiments of the present invention, a conductive fiber-coated particle according to an embodiment has flexibility. In this embodiment, assume that the conductive fiber-coated particle is incorporated into a curable composition, and the curable composition is molded into a microbumped shape. In this case, the conductive fiber-coated particle can conform to and deform along the bumped structure and extend even into fine portions of the structure. This can prevent the formation of a poorly conducting portion and give a cured article having excellent conductive performance. Further assume that the conductive fiber-coated particle having flexibility is incorporated into a curable composition, the curable composition is disposed between two components or members with fine bumps, and the two components are bonded with each other by thermocompression bonding. This can offer good electrical coupling between the two components.

In an embodiment, the conductive fiber-coated particle according to the present invention is incorporated into a curable composition, and the curable composition is formed or molded into a thin-film molded article. In this embodiment, the average particle diameter D [μm] of the particulate substance constituting the conductive fiber-coated particle and the thickness T [μm] of the molded article may be controlled within a specific range. The resulting thin-film molded article can develop such anisotropic conductivity as to exhibit conductivity selectively in the thickness direction. To use the thin-film molded article for electrical coupling between two components, the thin-film molded article has only to be disposed between the two components so as to establish electrical coupling between the components without providing an extra downstream thermocompression bonding step of applying heat and pressure. This allows a product using the molded article to be produced with better productivity.

BRIEF DESCRIPTION OF DRAWINGS

FIG. 1 is a scanning electron photomicrograph (SEM image) of a conductive fiber-coated particle prepared in Example 1 (conductive fiber-coated particle according to an embodiment of the present invention).

FIG. 2 is a schematic view (enlarged cross-sectional view) of a molded article according to an embodiment of the present invention and illustrates a relation between the average particle diameter (D) and the stacked thickness (L) of conductive fiber-coated particles in the molded article.

FIGS. 3(a), 3(b), and 3(c) are schematic cross-sectional views respectively of a conductive structure including highly flexible conductive fiber-coated particles, a conductive structure including poorly flexible conductive fiber-coated particles, and another conductive structure including poorly flexible conductive fiber-coated particles, each according to an embodiment.

FIGS. 4(a) and 4(b) depict CCD images, observed respectively in a through mode and in a reflection mode, of a cured article 1 according to an embodiment prepared in examples.

FIGS. 5(a) and 5(b) depict CCD images, observed respectively in a through mode and a reflection mode, of a cured article 2 according to an embodiment prepared in the examples.

FIG. 6 depicts a CCD image of a cured article 6 according to an embodiment prepared in the examples, where the image was observed at 500-fold magnification.

FIG. 7 depicts a CCD image of a cured article 11 according to an embodiment prepared in the examples, where the image was observed at 500-fold magnification.

FIG. 8 is a graph indicating the volume resistivity of cured articles 6 to 9 according to embodiments prepared in the examples.

DESCRIPTION OF EMBODIMENTS

Conductive Fiber-Coated Particles

The conductive fiber-coated particle according to an embodiment of the present invention includes a particulate substance and a fibrous conductive substance. The particulate substance is coated with the fibrous conductive substance. The "fibrous conductive substance" herein is also referred to as a "conductive fiber". In the conductive fiber-coated particle according to the present invention, the term "coated with" refers to that the particulate substance is coated with the conductive fiber in part or whole of its surface (is coated partially or entirely with the conductive fiber). In the conductive fiber-coated particle according to the present invention, the particulate substance has only to be coated with the conductive fiber in at least part of its surface. Typically, the particulate substance may include an uncoated portion in a larger amount (area) as compared with a coated portion. The conductive fiber-coated particle according to the present invention does not necessarily require the contact between the particulate substance and the conductive fiber. In general, however, part of the conductive fiber is in contact with the particulate substance surface.

FIG. 1 is a scanning electron photomicrograph of the conductive fiber-coated particle according to an embodiment of the present invention. As is indicated in FIG. 1, the conductive fiber-coated particle according to the present invention structurally includes a particulate substance (a spherical substance in FIG. 1) and a conductive fiber (a fibrous substance in FIG. 1) covering at least part of the particulate substance.

Particulate Substance

The particulate substance constituting the conductive fiber-coated particle according to the present invention is a substance in the form of a particle.

The particulate substance may include a material (ingredient) which is exemplified by, but not limited to, known or common materials such as metals, plastics, rubbers, ceramics, glass, and silica. Among them, transparent materials such as transparent plastics, glass, and silica are preferably used herein, of which transparent plastics are particularly preferably used.

The transparent plastics include thermosetting resins and thermoplastic resins. The thermosetting resins are exemplified by poly(meth)acrylate resins; polystyrene resins; polycarbonate resins; polyester resins; polyurethane resins; epoxy resins; polysulfone resins; amorphous polyolefin resins; network polymers prepared by polymerizing a multifunctional monomer alone or in combination with one or more other monomers, where the multifunctional monomer is exemplified by divinylbenzene, hexatriene, divinyl ether, divinyl sulfone, diallylcarbinol, alkylene diacrylates, oligo- or poly-alkylene glycol diacrylates, oligo- or poly-alkylene glycol dimethacrylates, alkylene triacrylates, alkylene tetraacrylates, alkylene trimethacrylates, alkylene tetramethacrylates, alkylenebisacrylamides, alkylenebismethacrylamides, and polybutadiene oligomers with both terminals modified with acrylic; and other resins such as phenol formaldehyde resins, melamine formaldehyde resins, benzoguanamine formaldehyde resins, and urea formaldehyde resins. The thermoplastic resins are exemplified by copoly (ethylene/vinyl acetate), copoly(ethylene/vinyl acetate/unsaturated carboxylic acid), copoly(ethylene/ethyl acrylate), copoly(ethylene/methyl methacrylate), copoly(ethylene/acrylic acid), copoly(ethylene/methacrylic acid), copoly (ethylene/maleic anhydride), copoly(ethylene/aminoalkyl methacrylate), copoly(ethylene/vinylsilane), copoly(ethylene/glycidyl methacrylate), and copoly(and ethylene/hydroxyethyl methacrylate).

The particulate substance may have any shape which is not limited, but may be selected from globular (e.g., spherical, approximately spherical, or ellipsoidal), polyhedral, rod-like (e.g., cylindrical or prismatic), tabular, scaly, and amorphous shapes. In particular, the particulate substance for use in the present invention preferably has a globular or rod-like shape, more preferably has a globular shape, and particularly preferably has a spherical shape. These shapes are preferred because the conductive fiber-coated particle can be produced with high productivity, is readily uniformly dispersed in a curable compound, and can easily impart conductivity entirely to a cured article.

The particulate substance may have an average aspect ratio not critical, but preferably less than 20 (e.g., from 1 to less than 20) and particularly preferably from 1 to 10. Assume that the conductive fiber-coated particle includes a particulate substance having an average aspect ratio greater than the range. The conductive fiber-coated particle in this case, when combined in a small amount with the curable compound, may fail to allow the curable compound to develop excellent conductivity. The average aspect ratio of the particulate substance may be determined typically by taking electron photomicrographs of the particulate substance in a sufficient number using an electron microscope (SEM or TEM), measuring the aspect ratios of the particulate substance (individual particles), and arithmetically averaging the aspect ratios. The sufficient number is typically 100 or more, preferably 300 or more; and particularly preferably 100 or 300.

The particulate substance may have any structure not limited and may have a single-layer structure, or a multilayer structure including two or more layers. The particulate substance may be in the form of any particle selected typically from solid particles, hollow particles, and porous particles.

The particulate substance may have an average particle diameter not critical, but preferably from 0.1 to 100 µm, particularly preferably from 1 to 50 µm, and most preferably from 5 to 30 µm. The particulate substance, if having an average particle diameter of less than the range, may fail to allow the conductive fiber-coated particle to exhibit excellent conductivity by the incorporation of a small amount of the conductive fiber-coated particle. In contrast, the particulate substance, if having an average particle diameter of greater than the range, may cause the resulting cured article (including the conductive fiber-coated particle) to have lower transparency. In an embodiment, the particulate substance has an anisotropic shape. In this embodiment, an average particle diameter of the particulate substance in the major axis (longest axis) direction is preferably controlled within the range. The "average particle diameter" of the particulate substance refers to a median diameter (d50) as measured by the laser diffraction scattering method.

The particulate substance is preferably transparent. Specifically, the particulate substance may have a total luminous transmittance not critical, but preferably 70% or more and particularly preferably 75% or more in the visible wavelength region. The particulate substance, if having a total luminous transmittance of less than the range, may cause the cured article (including the conductive fiber-coated particle) to have lower transparency. In an embodiment, the particulate substance is a plastic particle. In this embodiment, the total luminous transmittance of the particulate substance in the visible wavelength region may be determined by casting 1 g of the particulate substance in a mold, subjecting the cast particulate substance to compression molding at 210° C. and 4 MPa to give a 1-mm thick flat plate, and measuring the total luminous transmittance of the flat plate in the visible wavelength region in conformity to JIS K7361-1.

In an embodiment, the conductive fiber-coated particle is used for bonding a first conductive substrate and a second conductive substrate, where the first conductive substrate has a bumped surface (surface having asperities) as at least one surface thereof, and the bumped surface is to be bonded to one surface of the second conductive substrate. In this embodiment, the particulate substance preferably has flexibility and may have a 10% compressive strength of typically 3 kgf/mm$^2$ or less, preferably 2 kgf/mm$^2$ or less, and particularly preferably 1 kgf/mm$^2$ or less. The conductive fiber-coated particle, when including the particulate substance having a 10% compressive strength within the range, can conform to and deform along the microbumped structure by pressurization (compression). In an embodiment, the conductive fiber-coated particle is incorporated into a curable composition, and the curable composition is cured into a shape with a microbumped structure. In this embodiment, the particulate substance can extend even into fine portions to prevent the formation of a poorly conducting portion.

The particulate substance may have a refractive index not critical, but preferably from 1.4 to 2.7 and particularly preferably from 1.5 to 1.8. In an embodiment, the particulate substance is a plastic particle. In this embodiment, the refractive index of the particulate substance may be determined in the following manner. One gram (1 g) of the particulate substance is cast into a mold, compression-molded at 210° C. and 4 MPa to give a 1-mm thick flat plate. A test specimen 20 mm long by 6 mm wide is cut out from the prepared flat plate. The refractive index of the test specimen is measured at the sodium D line at 20° C. using a multi-wavelength Abbe refractometer (trade name DR-M2, supplied by ATAGO Co., Ltd.) while keeping a prism and the test specimen in intimate contact with each other using monobromonaphthalene as a contact liquid.

The particulate substance preferably has a small difference in refractive index from the curable compound used as a binder resin. This is preferred to allow the cured article to have still better transparency. Typically, the difference in refractive index between the particulate substance and the curable compound is preferably about 10% or less of the refractive index of the curable compound.

Specifically, to allow the cured article to have still better transparency, the difference in refractive index between the particulate substance and the curable compound preferably meets conditions specified as follows:

$$|(\text{Refractive index of particulate substance})-(\text{Refractive index of curable compound})|/(\text{Refractive index of curable compound})\leq 0.1$$

$$-0.1\leq(\text{Refractive index of particulate substance})-(\text{Refractive index of curable compound}))/(\text{Refractive index of curable compound})\leq 0.1$$

The particulate substance may be produced by any known or common method not limited. In an embodiment, the particulate substance is a metal particle. This particulate substance may be produced typically by a gas phase method such as CVD or spray pyrolysis, or a wet method by a chemical reduction reaction. In another embodiment, the particulate substance is a plastic particle. This particulate substance may be produced typically by polymerizing monomer(s) to constitute any of the above-exemplified resins (polymers) by a known polymerization method such as suspension polymerization, emulsion polymerization, seed polymerization, and dispersion polymerization.

The particulate substance for use herein may be selected from commercial products. Typically, particulate substances including a thermosetting resin are available typically under the trade names of TECHPOLYMER MBX Series, TECHPOLYMER BMX Series, TECHPOLYMER ABX Series, TECHPOLYMER ARX Series, and TECHPOLYMER AFX Series (each from Sekisui Plastics Co., Ltd.); and the trade names of Micropearl SP and Micropearl SI (each from Sekisui Chemical Co., Ltd.). Particulate substances including a thermoplastic resin are available typically under the trade name of SOFT BEADS (from Sumitomo Seika Chemicals Co., Ltd.) and the trade name of DUOMASTER (Sekisui Plastics Co., Ltd).

Fibrous Conductive Substance (Conductive Fiber) The conductive fiber constituting the conductive fiber-coated particle according to the present invention is a fibrous structure (linear structure) having conductivity. The conductive fiber may have a shape not critical, as long as being fibrous (fiber-like), but preferably has an average aspect ratio of preferably 10 or more (e.g., from 20 to 5000), particularly preferably from 50 to 3000, and most preferably from 100 to 1000. The conductive fiber, if having an average aspect ratio of less than the range, may fail to allow the cured article to exhibit excellent conductivity by the incorporation of a small amount of the conductive fiber-coated particle. The average aspect ratio of the conductive fiber may be determined by the procedure for the average aspect ratio of the particulate substance. The concept of "fibrous" in the conductive fiber also includes various linear-structure shapes such as "wire-like" and "rod-like" shapes. As used herein the term "nanowire" refers to a "fiber having an average thickness of 1000 nm or less".

The conductive fiber may have an average thickness (average diameter) not critical, but preferably from 1 to 400 nm, particularly preferably from 10 to 200 nm, and most preferably from 50 to 100 nm. The conductive fiber, if having an average thickness of less than the range, may become susceptible to aggregate with each other and may impede the production of the conductive fiber-coated particle. In contrast, the conductive fiber, if having an average thickness of greater than the range, may cover the particulate substance with difficulty, and this may impede efficient production of the conductive fiber-coated particle. The average thickness of the conductive fiber may be determined by taking electron photomicrograph of the conductive fibers in a sufficient number with an electron microscope (SEM or TEM), measuring the thicknesses (diameters) of the conductive fibers, and arithmetically averaging the measured thicknesses. The sufficient number is typically 100 or more, preferably 300 or more; and in particular, 100 or 300.

The conductive fiber may have an average length not critical, but preferably from 1 to 100 μm, particularly preferably from 5 to 80 μm, and most preferably from 10 to 50 μm. The conductive fiber, if having an average length of less than the range, may cover the particulate substance with difficulty, and this may impede efficient production of the conductive fiber-coated particle. In contrast, the conductive fiber, if having an average length of greater than the range, may adhere to or be adsorbed by two or more particles and may cause aggregation (deterioration in dispersibility) of the conductive fiber-coated particle. The average length of the conductive fiber may be determined by taking electron photomicrographs of the conductive fibers in a sufficient number with an electron microscope (SEM or TEM), measuring the lengths of the conductive fibers, and arithmetically averaging the measured lengths. The sufficient number is typically 100 or more, preferably 300 or more; and in particular 100 or 300. The length of the conductive fiber should be measured while straightening the fiber. In actual, however, many of such fibers are curved. Accordingly, the length of one conductive fiber is herein determined by calculating the projected diameter and projected area of the conductive fiber from the electron photomicrograph using an image analyzer, and calculating the length according to a formula as follows on the assumption that the conductive fiber is a solid cylinder:

$$\text{Length}=(\text{Projected area})/(\text{Projected diameter})$$

The conductive fiber may include any material (ingredient), as long as being an ingredient having conductivity. Such ingredients are exemplified by metals, semiconductors, carbon materials, and conductive polymers.

The metals are exemplified by known or common metals such as gold, silver, copper, iron, nickel, cobalt, and tin; and alloys of them. Among them, silver is preferred herein for its excellent conductivity.

The semiconductors are exemplified by known or common semiconductors such as cadmium sulfide and cadmium selenide.

The carbon materials are exemplified by known or common carbon materials such as carbon fibers and carbon nanotubes.

The conductive polymers are exemplified by polyacetylenes, polyacenes, poly-p-phenylenes, poly-p-phenylenevinylenes, polypyrroles, polyanilines, polythiophenes, and derivatives of them. The derivatives are exemplified by those containing, in a common polymer skeleton, one or more substituents such as alkyl, hydroxyl, carboxy, and ethylenedioxy. Specifically, the derivatives are exemplified by polyethylenedioxythiophenes. Among them, preferred herein are polyacetylenes, polyanilines and derivatives thereof, polypyrroles and derivatives thereof, and polythiophenes and derivatives thereof. The conductive polymers may each include a known or common dopant. The dopant is exemplified by acceptors such as halogens, halides, and Lewis acids; and donors such as alkali metals and alkaline earth metals.

The conductive fiber for use in the present invention is preferably selected from conductive nanowires, is particularly preferably at least one conductive nanowire selected from the group consisting of metal nanowires, semiconductor nanowires, carbon fibers, carbon nanotubes, and conductive polymer nanowires. In particular, the conductive fiber is most preferably a silver nanowire for excellent conductivity.

The conductive fibers as above may be produced by known or common production methods. Typically, the metal nanowires may each be produced typically by a liquid phase method or gas phase method. More specifically, the silver nanowires may be produced by any of methods described typically in Mater. Chem. Phys. 2009, 114, 333-338; Adv. Mater. 2002, 14, P 833-837; Chem. Mater. 2002, 14, P 4736-4745; and Japanese Unexamined Patent Application Publication (Translation of PCT Application) (JP-A) No. 2009-505358. The gold nanowires may be produced typically by a method described in JP-A No. 2006-233252. The copper nanowires may be produced typically by a method described in JP-A No. 2002-266007. The cobalt nanowires may be produced typically by a method described in JP-A No. 2004-149871. The semiconductor nanowires may be produced typically by a method described in JP-A No. 2010-208925. The carbon fibers may be produced typically by a method described in JP-A No. H06-081223. The carbon nanotubes may be produced typically by a method described in JP-A No. H06-157016. The conductive polymer nanowires may be produced typically by methods described in JP-A No. 2006-241334 and JP-A No. 2010-76044. The conductive fiber may also be selected from commercial products.

Conductive Fiber-Coated Particle Production Method

The conductive fiber-coated particle according to the present invention may be produced by mixing the particulate substance with the conductive fiber in a solvent. Specifically, the conductive fiber-coated particle according to the present invention may be produced typically by any of methods (1) to (4) as follows.

(1) The particulate substance is dispersed in a solvent to give a dispersion. This dispersion is also referred to as a "particle dispersion". Separately, the conductive fiber is dispersed in a solvent to give a dispersion. This dispersion is also referred to as a "fiber dispersion". The particle dispersion is mixed with the fiber dispersion, from which the solvents are removed as needed, to yield the conductive fiber-coated particle according to the present invention (or a dispersion of the conductive fiber-coated particle).

(2) The particle dispersion is combined and mixed with the conductive fiber, from which the solvent is removed as needed, to yield the conductive fiber-coated particle according to the present invention (or a dispersion of the conductive fiber-coated particle).

(3) The fiber dispersion is combined and mixed with the particulate substance, from which the solvent is removed as needed, to yield the conductive fiber-coated particle according to the present invention (or a dispersion of the conductive fiber-coated particle).

(4) The particulate substance and the conductive fiber are combined and mixed with a solvent, from which the solvent is removed as needed, to yield the conductive fiber-coated particle according to the present invention (or a dispersion of the conductive fiber-coated particle).

Among them, the method (1) is preferred in the present invention, because of allowing the resulting conductive fiber-coated particle to be homogeneous.

The solvent for use to in the production of the conductive fiber-coated particle according to the present invention is exemplified by water; alcohols such as methanol, ethanol, propanol, isopropyl alcohol, and butanol; ketones such as acetone, methyl ethyl ketone (MEK), and methyl isobutyl ketone (MIBK); aromatic hydrocarbons such as benzene, toluene, xylenes, and ethylbenzene; ethers such as diethyl ether, dimethoxyethane, tetrahydrofuran, and dioxane; esters such as methyl acetate, ethyl acetate, isopropyl acetate, and butyl acetate; amides such as N,N-dimethylformamide and N,N-dimethylacetamide; and nitriles such as acetonitrile, propionitrile, and benzonitrile. Each of them may be used alone or in combination (namely, as a solvent mixture). Among them, alcohols and ketones are preferred herein.

In an embodiment, the after-mentioned curable compound is liquid (e.g., an epoxy compound). This curable compound can be used also as the solvent. The use of such liquid curable compound as the solvent may eliminate the need of the step of removing the solvent(s) in the preparation of a curable composition including the curable compound and the conductive fiber-coated particle according to the present invention.

The solvent may have a viscosity not critical, but has a viscosity at 25° C. of preferably 10 cP or less (e.g., from 0.1 to 10 cP) and particularly preferably from 0.5 to 5 cP. This is preferred for efficient production of the conductive fiber-coated particle. The viscosity of the solvent at 25° C. may be measured typically using an E-type viscometer (trade name VISCONIC, supplied by Tokimec, Inc.) with a rotor 1°34'× R24 at a number of revolutions of 0.5 rpm and a measurement temperature of 25° C.

The solvent may have a boiling point of preferably 200° C. or lower, particularly preferably 150° C. or lower, and most preferably 120° C. or lower at 1 atmospheric pressure. The range is preferred for efficient production of the conductive fiber-coated particle.

Upon mixing of the particulate substance with the conductive fiber in the solvent, the particulate substance may be present in a content of typically from about 0.1 to about 50 parts by weight and preferably from 1 to 30 parts by weight, per 100 parts by weight of the solvent. The control of the particulate substance content within the range may contribute to more efficient formation of the conductive fiber-coated particle.

Upon mixing of the particulate substance with the conductive fiber in the solvent, the conductive fiber may be present in a content of typically from about 0.1 to about 50 parts by weight and preferably from 1 to 30 parts by weight, per 100 parts by weight of the solvent. The control of the conductive fiber content within the range may contribute to more efficient formation of the conductive fiber-coated particle.

Upon mixing of the particulate substance with the conductive fiber in the solvent, the ratio between the particulate substance and the conductive fiber is preferably such that the ratio [surface area:projected area] of the surface area of the particulate substance to the projected area of the conductive fiber is typically from about 100:1 to about 100:100 and preferably from 100:10 to 100:50. The control of the ratio within the range may contribute to more efficient formation of the conductive fiber-coated particle. The surface area of the particulate substance may be determined by determining a specific surface area by the BET method (in conformity to JIS 28830) and multiplying the specific surface area by the mass (used amount) of the particulate substance. The projected area of the conductive fiber may be determined by, as is described above, taking electron photomicrographs of the conductive fibers in a sufficient number using an electron microscope (SEM or TEM), calculating projected areas of these conductive fibers using an image analyzer, and arithmetically averaging the projected areas. The sufficient number is typically 100 or more, preferably 300 or more; and in particular, 100 or 300.

Removal of the solvent after mixing of the particulate substance with the conductive fiber gives the conductive fiber-coated particle according to the present invention as a solid. The removal of the solvent may be performed typically, but not limitatively, by a known or common method such as heating and/or distilling off under reduced pressure. The solvent does not always have to be removed. The dispersion after mixing may be used as intact typically as a dispersion of the conductive fiber-coated particle according to the present invention.

The conductive fiber-coated particle according to the present invention can be produced by mixing the ingredients (the particulate substance and the conductive fiber) in the solvent as described above, does not require complicated processes, and is advantageous in production cost. The conductive fiber-coated particle can be produced by a simple method of mixing the ingredients in a solvent. This is probably because the fibrous conductive substance (in particular, conductive fiber having an average aspect ratio of 10 or more) used as the ingredient has a large surface energy and preferentially adheres onto or is adsorbed by the particle surface so as to be stabilized with reduced surface energy.

In particular, the particulate substance and the conductive fiber are preferably used in a combination as follows. Specifically, the particulate substance, when having an average particle diameter of A [μm], is preferably used in combination with a conductive fiber having an average length of equal to or greater than A [μm], more preferably equal to or greater than A×1.5 [μm], particularly preferably equal to or greater than A×2.0, and most preferably equal to or greater than A×3.0 [μm]. This is preferred for more efficient production of the conductive fiber-coated particle according to the present invention. In an embodiment, the particulate substance is spherical or approximately spherical. Particularly in this embodiment, the particulate substance, when having an average circumference of B [μm], is preferably used in combination with a conductive fiber having an average length of equal to or greater than B×2/3 [μm], and more preferably equal to or greater than B [μm]. The average circumference (average peripheral length) of the particulate substance may be determined by taking electron photomicrographs of the particulate substance in a sufficient number using an electron microscope (SEM or TEM), measuring circumferences of these particulate substances (particles), and arithmetically averaging the measured circumferences. The sufficient number is typically 100 or more, preferably 300 or more; and, in particular, 100 or 300.

The conductive fiber-coated particle according to the present invention may include the particulate substance and the conductive fiber preferably in such a ratio that the ratio [surface area:projected area] of the surface area of the particulate substance to the projected area of the conductive fiber is typically from about 100:1 to about 100:100, and, in particular, from 100:10 to 100:50. This is preferred so as to more efficiently impart conductivity to the cured article while ensuring the transparency of the cured article. The surface area of the particulate substance and the projected area of the conductive fiber may be determined independently by the above-described methods.

The conductive fiber-coated particle according to the present invention is preferably transparent. Specifically, the conductive fiber-coated particle according to the present invention may have a total luminous transmittance not critical, but preferably 70% or more and particularly preferably 75% or more in the visible wavelength region. The conductive fiber-coated particle, if having a total luminous transmittance of less than the range, may cause the cured article (including the conductive fiber-coated particle) to have lower transparency. In an embodiment, the particulate substance in the conductive fiber-coated particle is a plastic particle. In this embodiment, the total luminous transmittance of the conductive fiber-coated particle in the visible wavelength region may be determined in a manner as follows. One gram (1 g) of the conductive fiber-coated particle is cast into a mold, compression-molded at 210° C. and 4 MPa to give a 1-mm thick flat plate, and the total luminous transmittance of the flat plate in the visible wavelength region is measured in conformity to JIS K7361-1.

The conductive fiber-coated particle according to the present invention, as having the configuration, can impart excellent conductivity (in particular, conductivity in the thickness direction) to a cured article by the addition in a small amount and allows the cured article to exhibit excellent transparency and conductivity.

In an embodiment, the conductive fiber-coated particle according to the present invention has flexibility (e.g., has a 10% compressive strength of 3 kgf/mm$^2$ or less). In this embodiment, assume that the conductive fiber-coated particle is used to form a curable composition, and the curable composition is shaped or formed into a microbumped shape. In this case, the conductive fiber-coated particle conforms to and deforms along the bumped structure and extends even into fine portions of structure. The curable composition thereby forms a cured article having excellent conductive performance while preventing the formation of a poorly conducting portion.

In an embodiment, the conductive fiber-coated particle according to the present invention contains a particulate substance including a thermoplastic resin, and the thermoplastic resin has a melting point of equal to or lower than the curing temperature (temperature upon curing by heating) of the curable compound. In this embodiment, assume that a curable composition including the conductive fiber-coated particle is cured by heating. In this case, the particulate substance including the thermoplastic resin in the conductive fiber-coated particle is melted. This eliminates an interface (interface between the curable composition and the conductive fiber-coated particle) and allows the cured article to have extremely excellent transparency, because such interface causes light scattering. In addition, the melting of the particulate substance including the thermoplastic resin reduces internal stress. This may allow the resulting cured article to resist deformation and/or cracking.

Curable Composition

The curable composition according to an embodiment of the present invention includes the conductive fiber-coated particle and a curable compound. The curable composition may include each of different conductive fiber-coated particles according to the present invention alone or in combination.

The curable compound is exemplified by compounds acting as ingredients (raw materials) of thermoplastic resins and curable resins. Each of them may be used alone or in combination. The thermoplastic resins are exemplified by polyolefins such as polyethylenes, polypropylenes, and polybutadienes; vinyl polymers such as acrylic resins and polystyrenes; polyamides such as nylon 6, nylon 66, nylon 11, nylon 12, nylon 610, nylon 612, nylon 61, nylon 6T, and nylon 9T; polyesters such as poly(ethylene terephthalate)s, poly(butylene terephthalate)s, and poly(ethylene naphthalate)s; and other polymers such as poly(vinyl chloride)s, poly(vinylidene chloride)s, polycarbonates, polyacetals, poly(phenylene oxide)s, poly(phenylene sulfide)s, poly(ether sulfone)s, and poly(ether ether ketone)s. The curable resins are exemplified by epoxy resins, oxetane resins, unsaturated polyesters, vinyl ester resins, allyl resins (e.g., diallyl phthalate resins), phenol resins, polyimide resins, cyanate resins, maleimide resins, urea resins, melamine resins, and silicone resins.

Among them, preferred as the curable compound are compounds that act as ingredients (materials) to form curable resins. These compounds are easily moldable and readily give a cured article excellent in mechanical properties and transparency. Specifically, these compounds are compounds that are each cured by the application of an active energy ray and/or heat to form a cured article and are exemplified by heat-induced cationically curable compounds, active energy ray-induced cationically curable compounds, heat-induced radically curable compounds, and active energy ray-induced radically curable compound. Among them, epoxy compounds are particularly preferred.

The epoxy compounds include known or common epoxy compounds such as aromatic glycidyl ether epoxy compounds; aliphatic glycidyl ether epoxy compounds; glycidyl ester epoxy compounds; glycidylamine epoxy compounds; and alicyclic epoxy compounds.

The aromatic glycidyl ether epoxy compounds are exemplified by bisphenol-A epoxy compounds, bisphenol-F epoxy compounds, biphenol epoxy compounds, phenol novolac epoxy compounds, cresol novolac epoxy compounds, bisphenol-A cresol novolac epoxy compounds, naphthalene epoxy compounds, and trisphenolmethane epoxy compounds.

The aliphatic glycidyl ether epoxy compounds are exemplified by mono- or poly-glycidyl ethers of aliphatic polyhydric alcohols such as polyethylene glycols, polypropylene glycols, glycerol, and tetramethylene glycol.

The alicyclic epoxy compounds are each a compound containing at least an alicycle (aliphatic ring) structure and an epoxy group in the molecule (per molecule). They are exemplified by (i) compounds containing an alicyclic epoxy group, where the alicyclic epoxy group is an epoxy group including an oxygen atom and two adjacent carbon atoms constituting an alicycle; (ii) compounds containing an epoxy group bonded directly through a single bond to an alicycle; and (iii) hydrogenated glycidyl ether epoxy compounds.

The epoxy group (alicyclic epoxy group) including an oxygen atom and two adjacent carbon atoms constituting an alicycle is preferably cyclohexene oxide group. The cyclohexane oxide group is an epoxy group including an oxygen atom and two carbon atoms constituting a cyclohexane ring. Specifically, of the compounds (i) containing an alicyclic epoxy group, preferred are compounds containing one or more cyclohexene oxide groups per molecule, and particularly preferred are compounds represented by Formula (1):

[Chem. 1]

(1)

In Formula (1), X represents a monovalent organic group. The monovalent organic group is exemplified by hydrocarbon groups (monovalent hydrocarbon groups), alkoxy (e.g., $C_1$-$C_6$ alkoxy), alkenyloxy (e.g., $C_2$-$C_6$ alkenyloxy), aryloxy (e.g., $C_6$-$C_{14}$ aryloxy), aralkyloxy (e.g., $C_7$-$C_{18}$ aralkyloxy), acyloxy (e.g., $C_1$-$C_{12}$ acyloxy), alkylthio (e.g., $C_1$-$C_6$ alkylthio), alkenylthio (e.g., $C_2$-$C_6$ alkenylthio), arylthio (e.g., $C_6$-$C_{14}$ arylthio), aralkylthio (e.g., $C_7$-$C_{18}$ aralkylthio), carboxy, alkoxycarbonyl (e.g., ($C_1$-$C_6$ alkoxy)-carbonyl), aryloxycarbonyl (e.g., $C_6$-$C_{14}$ aryloxy-carbonyl), aralkyloxycarbonyl (e.g., ($C_7$-$C_{18}$ aralkyloxy)-carbonyl), glycidyl, epoxy, cyano, isocyanato, carbamoyl, isothiocyanato, and groups each including one or more of these groups bonded with an after-mentioned linkage group. The "linkage group" refers to a divalent group containing one or more atoms.

The hydrocarbon groups are exemplified by aliphatic hydrocarbon groups, alicyclic hydrocarbon groups, aromatic hydrocarbon groups, and groups each including two or more of them bonded to each other.

The aliphatic hydrocarbon groups are exemplified by $C_1$-$C_{20}$ alkyl such as methyl, ethyl, propyl, isopropyl, butyl, hexyl, octyl, isooctyl, decyl, and dodecyl; $C_2$-$C_{20}$ alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl; $C_2$-$C_{20}$ alkynyl such as ethynyl and propynyl.

The alicyclic hydrocarbon groups are exemplified by $C_3$-$C_{12}$ cycloalkyl such as cyclopropyl, cyclobutyl, cyclopentyl, cyclohexyl, and cyclododecyl; $C_3$-$C_{12}$ cycloalkenyl such as cyclohexenyl; and $C_4$-$C_{15}$ bridged hydrocarbon groups such as bicycloheptyl and bicycloheptenyl.

The aromatic hydrocarbon groups are exemplified by $C_6$-$C_{14}$ aryl such as phenyl and naphthyl, of which $C_6$-$C_{10}$ aryl is preferred.

The groups including an aliphatic hydrocarbon group and an alicyclic hydrocarbon group bonded to each other are exemplified by ($C_3$-$C_{12}$ cycloalkyl)-$C_1$-$C_{20}$ alkyl such as cyclohexylmethyl; and ($C_1$-$C_{20}$ alkyl)-$C_3$-$C_{12}$ cycloalkyl such as methylcyclohexyl. The groups including an aliphatic hydrocarbon group and an aromatic hydrocarbon group bonded to each other are exemplified by $C_7$-$C_{18}$ aralkyl such as benzyl and phenethyl; ($C_6$-$C_{10}$ aryl)-$C_2$-$C_6$ alkenyl such as cinnamyl; ($C_1$-$C_4$ alkyl)-substituted aryl such as tolyl; and ($C_2$-$C_4$ alkenyl)-substituted aryl such as styryl.

The hydrocarbon groups may each have one or more substituents. The substituents are exemplified by halogen such as fluorine, chlorine, bromine, and iodine; hydroxyl;

$C_1$-$C_6$ alkoxy such as methoxy, ethoxy, propoxy, isopropyloxy, butoxy, and isobutyloxy; $C_2$-$C_6$ alkenyloxy such as allyloxy; $C_6$-$C_{14}$ aryloxy optionally including, on the aromatic ring, one or more substituents (selected from the group consisting of $C_1$-$C_4$ alkyl, $C_2$-$C_4$ alkenyl, halogen, and $C_1$-$C_4$ alkoxy), such as phenoxy, tolyloxy, and naphthyloxy; $C_7$-$C_{18}$ aralkyloxy such as benzyloxy and phenethyloxy; $C_1$-$C_{12}$ acyloxy such as acetyloxy, propionyloxy, (meth)acryloyloxy, and benzoyloxy; mercapto; $C_1$-$C_6$ alkylthio such as methylthio and ethylthio; $C_2$-$C_6$ alkenylthio such as allylthio; $C_6$-$C_{14}$ arylthio optionally including, on the aromatic ring, one or more substituents (selected from the group consisting of $C_1$-$C_4$ alkyl, $C_2$-$C_4$ alkenyl, halogen, and $C_1$-$C_4$ alkoxy), such as phenylthio, tolylthio, and naphthylthio; $C_7$-$C_{18}$ aralkylthio such as benzylthio and phenethylthio; carboxy; ($C_1$-$C_6$ alkoxy)-carbonyl such as methoxycarbonyl, ethoxycarbonyl, propoxycarbonyl, and butoxycarbonyl; ($C_6$-$C_{14}$ aryloxy)-carbonyl such as phenoxycarbonyl, tolyloxycarbonyl, and naphthyloxycarbonyl; ($C_7$-$C_{18}$ aralkyloxy)-carbonyl such as benzyloxycarbonyl; amino; mono- or di-($C_1$-$C_6$ alkyl)amino such as methylamino, ethylamino, dimethylamino, and diethylamino; $C_1$-$C_{11}$ acylamino such as acetylamino, propionylamino, and benzoylamino; epoxy-containing groups such as epoxy, glycidyl, glycidyloxy, and cyclohexene oxide groups; oxetanyl-containing groups such as ethyloxetanyloxy; acyl such as acetyl, propionyl, and benzoyl; oxo; and groups each including two or more of them with or without the mediation of $C_1$-$C_6$ alkylene.

Of the compounds represented by Formula (1), particularly preferred are compounds represented by Formula (2). These compounds are preferred so as to allow the cured article to have excellent heat resistance and light resistance. Formula (2) is expressed as follows:

[Chem. 2]

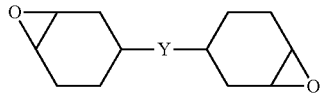

(2)

In Formula (2), Y represents a single bond or a linkage group. The "linkage group" refers to a divalent group containing one or more atoms. The linkage group is exemplified by divalent hydrocarbon groups, carbonyl, ether bond, ester bond, carbonate group, amido, and groups each including two or more of them linked to each other.

The alicyclic epoxy compound represented by Formula (2) where Y is a single bond is exemplified by (3,4,3',4'-diepoxy)bicyclohexyl.

The divalent hydrocarbon groups are exemplified by linear or branched chain $C_1$-$C_{18}$ alkylene and divalent alicyclic hydrocarbon groups. The linear or branched chain $C_1$-$C_{18}$ alkylene is exemplified by methylene, methylmethylene, dimethylmethylene, ethylene, propylene, and trimethylene. The divalent alicyclic hydrocarbon groups are exemplified by divalent cycloalkylene and divalent cycloalkylidene, such as 1,2-cyclopentylene, 1,3-cyclopentylene, cyclopentylidene, 1,2-cyclohexylene, 1,3-cyclohexylene, 1,4-cyclohexylene, and cyclohexylidene.

Among them, particularly preferred as the linkage group Y are oxygen-containing linkage groups. Specifically, preferred examples thereof include —CO— (carbonyl), —O—CO—O— (carbonate group), —COO— (ester bond), —O— (ether bond), and —CONH— (amide bond); groups each including two or more of these groups linked to each other; and groups each including one or more of these groups linked to one or more divalent hydrocarbon groups. The divalent hydrocarbon groups are exemplified as above.

The alicyclic epoxy compounds represented by Formula (2) are typified by compounds represented by Formulae (2-1) to (2-10) below. In Formulae (2-5) and (2-7), l and m each independently represents an integer of from 1 to 30. In Formula (2-5), R represents, independently in each occurrence, $C_1$-$C_8$ alkylene and is exemplified by linear or branched chain alkylene such as methylene, ethylene, propylene, isopropylene, butylene, isobutylene, s-butylene, pentylene, hexylene, heptylene, and octylene. Among them, preferred are linear or branched chain $C_1$-$C_3$ alkylene such as methylene, ethylene, propylene, and isopropylene. In Formulae (2-9) and (2-10), n1 to n6 each independently represent an integer of from 1 to 30.

[Chem. 3]

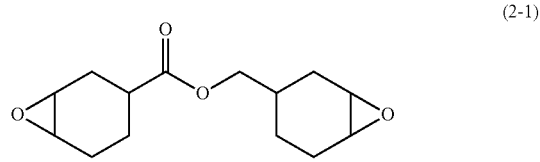

(2-1)

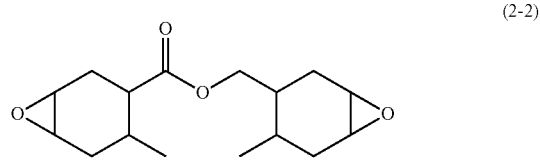

(2-2)

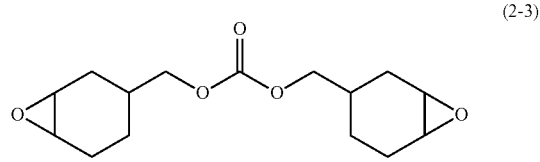

(2-3)

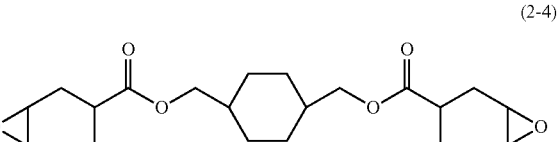

(2-4)

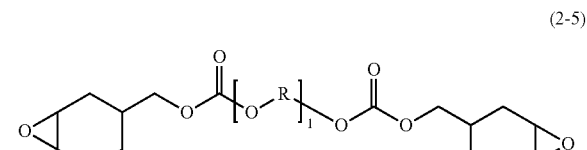

(2-5)

(2-6)

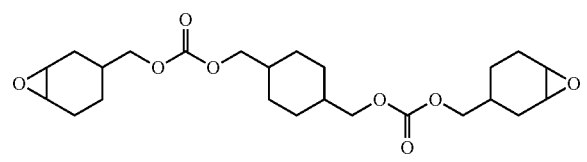

(2-7)

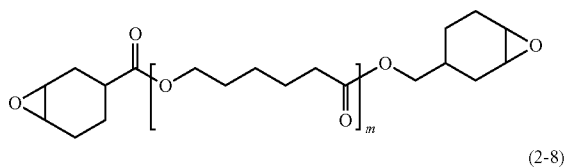

(2-8)

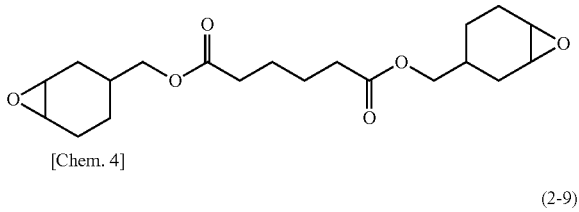

[Chem. 4]

(2-9)

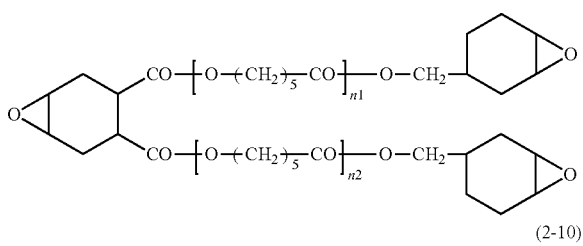

(2-10)

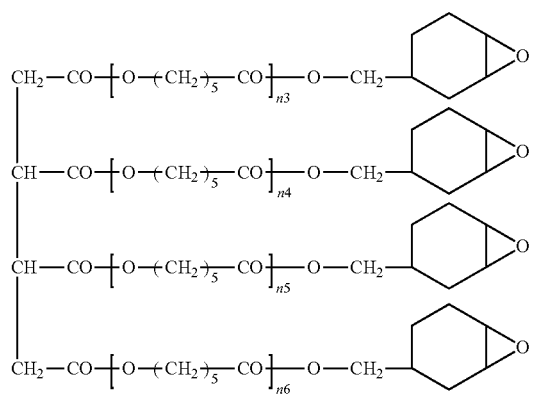

The compounds (i) containing an alicyclic epoxy group for use herein are also available as commercial products typically under the trade names of CELLOXIDE 2021P and CELLOXIDE 2081 (each from Daicel Corporation).

The alicyclic epoxy compounds (ii) containing an epoxy group directly bonded to an alicycle through a single bond are exemplified by compounds represented by Formula (3):

[Chem. 5]

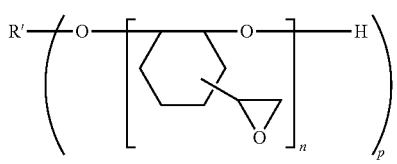
(3)

In Formula (3), R' represents a group (residue) corresponding to a p-hydric alcohol, except for removing —OH in a number of p therefrom; and p and n each independently represent a natural number. The p-hydric alcohol [R'—(OH)$_p$] is exemplified by polyhydric alcohols such as 2,2-bis(hydroxymethyl)-1-butanol, of which $C_1$-$C_{15}$ polyhydric alcohols are preferred. The repetition number p is preferably from 1 to 6, and the repetition number n is, independently in each occurrence, preferably from 1 to 30. When p is 2 or more, two or more occurrences of n in the group in the large brackets may be identical or different. Specifically, the compounds are exemplified by 1,2-epoxy-4-(2-oxiranyl)cyclohexane adduct of 2,2-bis(hydroxymethyl)-1-butanol.

The hydrogenated glycidyl ether epoxy compounds (iii) are exemplified by compounds as hydrogenated products of bisphenol-A epoxy compounds (hydrogenated bisphenol-A epoxy compounds) such as 2,2-bis[4-(2,3-epoxypropoxy)cyclohexyl]propane and 2,2-bis[3,5-dimethyl-4-(2,3-epoxypropoxy)cyclohexyl]propane; compounds as hydrogenated products of bisphenol-F epoxy compounds (hydrogenated bisphenol-F epoxy compounds), such as bis[o,o-(2,3-epoxypropoxy)cyclohexyl]methane, bis[o,p-(2,3-epoxypropoxy)cyclohexyl]methane, bis[p,p-(2,3-epoxypropoxy)cyclohexyl]methane, and bis[3,5-dimethyl-4-(2,3-epoxypropoxy)cyclohexyl]methane; hydrogenated biphenol epoxy compounds; hydrogenated phenol novolac epoxy compounds; hydrogenated cresol novolac epoxy compounds; hydrogenated cresol novolac epoxy compounds of bisphenol-A; hydrogenated naphthalene epoxy compounds; and hydrogenated products of trisphenolmethane epoxy compounds.

Among them, the curable compound for use in the present invention is preferably selected from 3,4-epoxycyclohexylmethyl (3,4-epoxy)cyclohexane carboxylate and (3,4,3',4'-diepoxy)bicyclohexyl.

The curable composition may contain the conductive fiber-coated particle in an amount (blending quantity) of typically from about 0.01 to about 30 parts by weight, preferably from 0.1 to 20 parts by weight, more preferably from 0.3 to 15 parts by weight, and particularly preferably from 0.5 to 5 parts by weight, per 100 parts by weight of the curable compound. The curable composition, if containing the conductive fiber-coated particle in an amount of less than the range, may cause the resulting cured article to have insufficient conductivity in some uses. In contrast, the curable composition, if containing the conductive fiber-coated particle in an amount of greater than the range, may cause the cured article to have insufficient transparency in some uses.

The curable composition may contain the conductive fiber-coated particle in a content of preferably from 0.1 to 60 percent by volume, more preferably from 0.2 to 60 percent by volume, particularly preferably from 0.3 to 50 percent by volume, and most preferably from 0.3 to 40 percent by volume, based on the total amount (100 percent by volume) of the curable composition.

In an embodiment, the cured article is designed to develop anisotropic conductivity, i.e., such an electric anisotropy that the cured article has conductivity in a specific direction, but is insulating in other directions. In particular in this embodiment, the curable composition may contain the conductive fiber-coated particle in a content of preferably 30 percent by volume or less (e.g., from 0.1 to 10 percent by volume) and particularly preferably from 0.3 to 5 percent by volume, based on the total amount (100 percent by volume) of the curable composition. The curable composition, when containing the conductive fiber-coated particle in a content controlled within the range, may allow the cured article to develop excellent conductivity. In contrast, the curable composition, if containing the conductive fiber-coated particle in a content of greater than the range, may fail to allow the cured article to develop anisotropic conductivity. The content of the conductive fiber-coated particle can be approximated typically by dividing the total weight of the conductive fiber-coated particle by the density of the particle (the conductive fiber-coated particle).

In an embodiment, the conductive fiber-coated particle has a total luminous transmittance of 90% or more (for a thickness of 0.1 mm). The curable composition may contain this conductive fiber-coated particle in an amount (blending quantity) of typically from about 0.01 to about 7 parts by weight, preferably from 0.1 to 5 parts by weight, more preferably from 0.2 to 3.7 parts by weight, furthermore preferably from 0.3 to 3.7 parts by weight, particularly preferably from 0.3 to 3.0 parts by weight, and most preferably from 0.5 to 2.0 parts by weight, per 100 parts by weight of the curable compound. The curable composition, if containing the conductive fiber-coated particle having a light transmittance of 90% or more (for a thickness of 0.1 mm) in an amount of less than the range, may cause the cured article to have insufficient conductivity in some uses. In contrast, the curable composition, if containing the conductive fiber-coated particle having a light transmittance of 90% or more (for a thickness of 0.1 mm) in an amount of greater than the range, may cause the cured article to have insufficient transparency in some uses.

The curable composition may contain the conductive fiber-coated particle having a total luminous transmittance of 90% or more (for a thickness of 0.1 mm) in a content of typically from about 0.02 to about 8.0 percent by volume, preferably from 0.1 to 6.0 percent by volume, particularly preferably from 0.4 to 3.5 percent by volume, and most preferably from 0.6 to 2.5 percent by volume, based on the total amount (100 percent by volume) of the curable composition.

The curable composition may contain the particulate substance (the particulate substance in the conductive fiber-coated fine particle) in an amount (blending quantity) of typically from about 0.09 to about 6.0 parts by weight, preferably from 0.1 to 4.0 parts by weight, more preferably from 0.3 to 3.5 parts by weight, furthermore preferably from 0.3 to 3.0 parts by weight, particularly preferably from 0.3 to 2.5 parts by weight, and most preferably from 0.5 to 2.0 parts by weight, per 100 parts by weight of the curable compound. The curable composition, if containing the particulate substance in an amount of less than the range, may cause the cured article to have insufficient conductivity in some uses. In contrast, the curable composition, if containing the particulate substance in an amount of greater than the range, may cause the cured article to have insufficient transparency in some uses.

The curable composition may contain the particulate substance in a content of typically from about 0.02 to about 7 percent by volume, preferably from 0.1 to 5 percent by volume, particularly preferably from 0.3 to 3 percent by volume, and most preferably from 0.4 to 2 percent by volume, based on the total amount (100 percent by volume) of the curable composition.

The curable composition may contain the conductive fiber in an amount (blending quantity) of typically from about 0.01 to about 1.0 part by weight, preferably from 0.02 to 0.8 part by weight, more preferably from 0.03 to 0.6 part by weight, particularly preferably from 0.03 to 0.4 part by weight, and especially preferably from 0.03 to 0.2 part by weight, per 100 parts by weight of the curable compound. The curable composition, if containing the conductive fiber in an amount of less than the range, may cause the cured article to have insufficient conductivity in some uses. In contrast, the curable composition, if containing the conductive fiber in an amount of greater than the range, may cause the cured article to have insufficient transparency in some uses.

The curable composition may contain the conductive fiber in a content of preferably from 0.01 to 1.1 percent by volume, more preferably from 0.02 to 0.9 percent by volume, particularly preferably from 0.03 to 0.7 percent by volume, and most preferably from 0.03 to 0.4 percent by volume, based on the total amount (100 percent by volume) of the curable composition.

The curable composition may contain the curable compound (in particular, epoxy compound) in a content (blending quantity) of typically from about 1 to about 99 percent by weight, preferably from 10 to 99 percent by weight, and particularly preferably from 15 to 99 percent by weight, based on the total amount (100 percent by weight) of the curable composition. The curable composition, if containing the curable compound in a content of less than the range, may cause the cured particle to be insufficient typically in mechanical strengths in some uses. In contrast, the curable composition, if containing the curable compound in a content of greater than the range, may cause the cured article to have insufficient conductivity in some uses.

The curable composition according to the present invention may further include a curing agent. The curing agent is a compound that reacts with and cures the curable compound. The curing agent is exemplified by acid anhydrides that are liquid at 25° C., such as methyltetrahydrophthalic anhydride, methylhexahydrophthalic anhydride, dodecenylsuccinic anhydride, and methyl-endomethylenetetrahydrophthalic anhydride. Each of them may be used alone or in combination. In an embodiment, an acid anhydrides that is solid at room temperature (about 25° C.) may be used herein as the curing agent. The acid anhydride of this type is exemplified by phthalic anhydride, tetrahydrophthalic anhydride, hexahydrophthalic anhydride, and methylcyclohexenedicarboxylic anhydride and is usable as a liquid mixture prepared by dissolving the same in an acid anhydride that is liquid at room temperature (about 25° C.) In the present invention, anhydrides of saturated monocyclic hydrocarbon dicarboxylic acids (including those having a substituent bonded on the ring). These are preferred so as to allow the cured article to have excellent resistance to heat, light, and cracking.

The curing agent may be selected from commercial products available typically under the trade names of RIKACID MH-700 and RIKACID MH-700F (each from New Japan Chemical Co., Ltd.); and the trade name of HN-5500 (from Hitachi Chemical Company, Ltd.).

The curable composition according to the present invention may contain the curing agent in an amount (blending quantity) of typically from about 50 to about 200 parts by weight and preferably from 100 to 145 parts by weight, per 100 parts by weight of the curable compound (e.g., epoxy compound). More specifically, the curing agent is preferably used in such an amount of from 0.5 to 1.5 equivalents per 1 equivalent of curable functional groups (e.g., epoxy groups) of all curable compounds contained in the curable composition according to the present invention. The curable composition, when employing the curing agent in an amount within the range, can allow the cured article to have excellent heat resistance, light resistance, and transparency.

In an embodiment, the curable composition according to the present invention includes the curing agent. In this embodiment, the curable composition preferably includes a curing accelerator. The curing accelerator is a compound that increases or speeds up the curing rate. The curing accelerator is exemplified by 1,8-diazabicyclo[5.4.0]undecene-7 (DBU) and salts thereof (e.g., phenol salt, octanoic acid salt, p-toluenesulfonic acid salt, formic acid salt, and tetraphenylborate salt); 1,5-diazabicyclo[4.3.0]nonene-5 (DBN) and salts thereof (e.g., phenol salt, octanoic acid salt, p-toluenesulfonic acid salt, formic acid salt, and tetraphenylborate salt); tertiary amines such as benzyldimethylamine, 2,4,6-tris(dimethylaminomethyl)phenol, and N,N-dimethylcyclohexylamine; imidazoles such as 2-ethyl-4-methylimidazole and 1-cyanoethyl-2-ethyl-4-methylimidazole; phosphoric esters, triphenylphosphine and other phosphines; phosphonium compounds such as tetraphenylphosphonium tetra(p-tolyl)borate; organometallic salts such as tin octanoate and zinc octanoate; and metal chelates. Each of them may be used alone or in combination.

The curing accelerator for use herein may be selected from commercial products available typically under the trade names of U-CAT SA 506, U-CAT SA 102, U-CAT 5003, and U-CAT 18X (each from San-Apro Ltd.); TPP-K and TPP-MK (each from Hokko Chemical Industry Co., Ltd.); and PX-4ET (from Nippon Chemical Industrial Co., Ltd.).

The curable composition according to the present invention may contain the curing accelerator in an amount (blending quantity) of typically from about 0.05 to about 5 parts by weight, preferably from 0.1 to 3 parts by weight, particularly preferably from 0.2 to 3 parts by weight, and most preferably from 0.25 to 2.5 parts by weight, per 100 parts by weight of the curable compound (e.g., epoxy compound) in the curable composition. The curable composition, when containing the curing accelerator in an amount within the range, allows the cured article to have excellent heat resistance, light resistance, and transparency.

The curable composition according to the present invention may include a curing catalyst, instead of the combination of the curing agent and the curing accelerator. The curing catalyst, when used, allows the curing reaction of the curable compound (e.g., epoxy compound) to proceed to form the cured article. The curing catalyst is exemplified by cationic catalysts (cationic-polymerization initiators) that generate a cationic species by the application of an active energy ray (in particular, an ultraviolet ray) or heat to initiate polymerization. Each of them may be used alone or in combination.

The cationic catalysts that generate a cationic species by the application of an active energy ray (in particular, an ultraviolet ray) are exemplified by hexafluoroantimonate salts, pentafluorohydroxyantimonate salts, hexafluorophosphate salts, and hexafluoroarsenate salts. They are also available as commercial products typically under the trade name of UVACURE 1590 (from DAICEL-CYTEC Company, Ltd.); the trade names of CD-1010, CD-1011, and CD-1012 (each from Sartomer Company Inc., U.S.A.); the trade name of IRGACURE 264 (from Ciba Japan K.K.); and the trade name of CIT-1682 (from Nippon Soda Co., Ltd.).

The cationic catalysts that generate a cationic species by the application of heat (heat treatment) are exemplified by aryldiazonium salts, aryliodonium salts, arylsulfonium salts, allene-ion complexes, compounds between a chelate compound and a silanol, and compounds between the chelate compound and a phenol. The chelate compound is exemplified by a chelate compound of a metal (e.g., aluminum or titanium) with acetoacetic acid or a diketone. The silanol is exemplified by triphenylsilanol. The phenol is exemplified by bisphenol-S. The cationic catalysts for use herein may be selected from commercial products available typically under the trade names of PP-33, CP-66, and CP-77 (each from ADEKA CORPORATION); the trade name of FC-509 (from 3M Company); the trade name of UVE1014 (from G.E.); the trade names of San-Aid SI-B3, San-Aid SI-60L, San-Aid SI-80L, San-Aid SI-100L, San-Aid SI-110L, and San-Aid SI-150L (each from SANSHIN CHEMICAL INDUSTRY CO., LTD.); and the trade name of CG-24-61 (from Ciba Japan K.K.).

The curable composition may contain the curing catalyst in an amount (blending quantity) of typically from about 0.01 to about 15 parts by weight, preferably from 0.01 to 12 parts by weight, particularly preferably from 0.05 to 10 parts by weight, and most preferably from 0.1 to 10 parts by weight, per 100 parts by weight of the curable compound (e.g., epoxy compound) in the curable composition. The curable composition, when containing the curing catalyst in an amount within the range, may allow the cured article to have excellent heat resistance, light resistance, and transparency.

The curable composition according to the present invention may further contain an additional conductive substance. The term "additional conductive substance" refers to a conductive substance excluding the conductive fiber-coated particle according to the present invention. The additional conductive substance for use herein may be selected from, but not limited to, known or common conductive substances. Typically, the additional conductive substance may be the conductive fiber.

The curable composition according to the present invention may contain the additional conductive substance (e.g., the conductive fiber) in an amount (blending quantity) of typically from about 0 to about 10 parts by weight, preferably from 0 to 5 parts by weight, particularly preferably from 0 to 1 part by weight, per 100 parts by weight of the conductive fiber-coated particle.

In addition to the above-mentioned components, the curable composition according to the present invention may further contain one or more of various additives within ranges not adversely affecting advantageous effects of the present invention. The additives are exemplified by common additives including hydroxyl-containing compounds such as ethylene glycol, diethylene glycol, propylene glycol, and glycerol; silicone- and fluorine-based antifoaming agents; leveling agents; silane coupling agents such as γ-glycidoxypropyltrimethoxysilane and 3-mercaptopropyltrimethoxysilane; surfactants; inorganic fillers such as silica and alumina; flame retardants; colorants; antioxidants; ultraviolet absorbers; ion adsorbents; pigments; phosphors; and releasing agents.

The curable composition according to the present invention may be used as a one-part composition or a multi-part (e.g., two-part) composition. The one-part composition is prepared by previously mixing all components such as the conductive fiber-coated particle (or a dispersion of the conductive fiber-coated particle), the curable compound, and optional additives added as needed. The multi-part composition is used so that part of the components such as the conductive fiber-coated particle (or a dispersion of the conductive fiber-coated particle), the curable compound, and optional additives added as needed are stored separately, and the separately stored part is mixed with the other part immediately before use.

The curable composition according to the present invention, as having the properties, may allow the cured article to excel in transparency and conductivity (in particular, conductivity in the thickness direction) and to be prepared inexpensively. In an embodiment, the conductive fiber-coated particle contained in the curable composition according to the present invention has flexibility. In this embodiment, even when the curable composition is molded into a microbumped shape, the conductive fiber-coated particle conforms to and deforms along the bumped structure and extends even into fine portions of the structure. The curable composition can allow the resulting cured article to have excellent conductive performance while preventing the formation of a poorly conducting portion. In another embodiment, the conductive fiber-coated particle in the curable composition has flexibility and structurally includes the particulate substance coated with the fibrous conductive substance, where the particulate substance includes a thermoplastic resin. In particular in this embodiment, when the curable composition is heated for curing, the conductive fiber-coated particle conforms to and deforms along the bumped structure and extends even into fine portions of the structure. Thereafter the particulate substance including the thermoplastic resin in the conductive fiber-coated particle is melted. This eliminates an interface (interface between the curable composition and the conductive fiber-coated particle) and allows the cured article to have extremely excellent transparency, because such interface causes light scattering. In addition, the melting of the particulate substance including the thermoplastic resin reduces internal stress and allows the cured article to be significantly resistant to cracking.

Curable Composition Production Method

The curable composition according to the present invention may be produced by mixing the conductive fiber-coated particle (or a dispersion of the conductive fiber-coated particle), the curable compound, and one or more optional additives added as needed. Typically, the curable composition may be produced by one of methods (1) and (2) as follows:

In the method (1), the particulate substance is mixed with the fibrous conductive substance in a solvent to give a dispersion of the conductive fiber-coated particle. The dispersion is mixed and stirred with the curable compound and one or more optional additives added as needed in predetermined proportions to give a mixture. The solvent is distilled off from the mixture to give the curable composition.

In the meted (2), the conductive fiber-coated particle is prepared through steps A and B below. The prepared conductive fiber-coated particle is mixed and stirred with the curable compound and one or more optional additives added as needed in predetermined proportions to give the curable composition.

The step A is the step of mixing the particulate substance with the fibrous conductive substance in a solvent to give a dispersion of the conductive fiber-coated particle.

The step B is the step of removing the solvent from the dispersion of the conductive fiber-coated particle prepared through the step A to give the conductive fiber-coated particle as a solid. The solvent removal may be performed typically by distilling off through heating and/or filtration under reduced pressure.

In an embodiment, a compound acting as an ingredient for a thermoplastic resin is used as the curable compound. In this embodiment, the stirring and mixing in the production method (1) or (2) is preferably performed with heating as needed.

In particular, the curable composition according to the present invention is preferably produced by the production method (2) so as to allow the curable composition to have excellent dispersibility of the curable compound. Assume that the curable composition is produced by the method (1) in a scale-up reaction (e.g., in production of a large capacity of 1 L or more). In this case, the production may require long-time heating to distill off the solvent. This may cause the curable compound to form aggregates due to proceeding of curing and to exhibit inferior dispersibility (to disperse poorly).

Cured Article

The cured article according to an embodiment of the present invention is obtained by curing the curable composition. In an embodiment, the curable composition includes, as the curable compound, a compound acting as an ingredient for a curable resin. In this embodiment, the cured article may be obtained by applying heat and/or an active energy ray to the curable composition.

The curing by heating may be performed at a temperature (curing temperature) of typically from about 45° C. to about 200° C., preferably from 70° C. to 190° C., and particularly preferably from 90° C. to 180° C. The curing by heating may be performed for a heating time (curing time) of typically from about 10 to about 600 minutes, preferably from 30 to 540 minutes, and particularly preferably from 60 to 480 minutes. The curing by heating, if performed at a curing temperature and/or for a curing time lower (shorter) than the range, may be insufficient. In contrast, the curing by heating, if performed at a curing temperature and/or for a curing time greater (longer) than the range, may cause the cured article to decompose. While depending on various conditions or factors, the curing conditions may be adjusted as appropriate. For example, the curing time may be defined shorter at a higher curing temperature; whereas the curing time may be defined longer at a lower curing temperature.

In an embodiment, the curable composition is cured by the application of an active energy ray. In this embodiment, the application (irradiation) is preferably performed under such conditions that an integrated light quantity (integrated exposure) be typically from about 500 to about 5000 mJ/cm$^2$ and particularly preferably from 1000 to 3000 mJ/cm$^2$.

In another embodiment, the curable composition contains, as the curable compound, a compound acting as an ingredient for a thermoplastic resin. In this embodiment, the curable compound, the conductive fiber-coated particle, and one or more optional additives added as needed may be mixed and stirred with each other with heating as needed to give the cured article.

The cured article according to the present invention is preferably transparent. The cured article, when adjusted to have a thickness of 10 μm, may have a total luminous transmittance of typically 80% or more, preferably 85% or more, and particularly preferably 90% or more in the visible wavelength region. The total luminous transmittance of the cured article according to the present invention in the visible wavelength region may be measured in conformity to JIS K7361-1.

The cured article according to the present invention exhibits excellent conductivity and may have a volume resistivity of typically from about 0.1Ω·cm to about 10 MΩ·cm and preferably from 0.1 Ω·cm to 1 MΩ·cm. The volume resistivity of the cured article according to the present invention may be measured in conformity to JIS K6911.

Molded Article

The molded article according to an embodiment of the present invention is a thin-film molded article formed from the curable composition. As used herein the term "thin-film" refers to a thin shape, and the structure of the "thin-film molded article" includes various thin-film structures such as "sheet-like", "film-like", "flat-plate-like", and "thin-sheet-like" structures.

The molded article according to the present invention may be produced typically by molding (shaping), or molding and curing, the curable composition produced by any of the production methods. The curable composition may be cured by a process as in the production methods of the cured article.

The molded article according to the present invention may have a thickness (T [μm]) not critical, but preferably from 0.5 to 500 μm, particularly preferably from 1 to 200 μm, and most preferably from 10 to 100 μm. The molded article, if having a thickness of less than 0.5 μm, may be produced with difficulty. In contrast, the molded article, if having a thickness of greater than 500 μm, may develop conductivity in the thickness direction with difficulty and may fail to exhibit transparency and conductivity both at satisfactory levels.

Assume that the molded article according to the present invention has a thickness T [μm], and that the particulate substance constituting the conductive fiber-coated particle has an average particle diameter D [μm]. In this case, the thickness T and the average particle diameter D preferably meet a condition as specified by Formula (I) below. This is preferred in electrical coupling between two components. Specifically, this allows the molded article to be designed so as to develop excellent conductivity in the thickness direction and to develop little conductivity in the in-plane direction (in the surface direction) without undergoing a complicated step or process such as a thermocompression bonding process. In other words, this enables designing of anisotropic conductivity.

$$(0.865L+1)D-0.3D \le T \le (0.865L+1)D+0.3D \quad (I)$$

In Formula (I), L represents an integer of 0 or more.

In particular, in the molded article according to the present invention, the thickness T [μm] of the molded article and the average particle diameter D [μm] of the particulate substance constituting the conductive fiber-coated particle more preferably meet a condition specified by Formula (I') and particularly preferably meet a condition specified by Formula (I"):

$$(0.865L+1)D-0.2D \le T \le (0.865L+1)D+0.2D \quad (I')$$

$$(0.865L+1)D-0.1D \le T \le (0.865L+1)D+0.1D \quad (I'')$$

In an embodiment, the molded article according to the present invention does not have a uniform thickness. In this embodiment, the thickness T [μm] refers to the average thickness of the molded article according to the present invention, and T and D preferably meet the condition specified by Formula (I). The average thickness of the molded article may be determined typically by measuring thicknesses at different ten (10) or more points (e.g., 10 points, 20 points, or 30 points) in the molded article according to the present invention, and averaging (arithmetically averaging) the measured thicknesses.

The condition specified by Formula (I) means that the molded article readily develops conductivity specifically in the thickness direction in a first or second case as follows. In the first case, the molded article according to the present invention has a thickness T [μm] approximate to the average particle diameter D [μm] of the particulate substance constituting the conductive fiber-coated particle (namely, L=0). In the second case, the molded article according to the present invention has a thickness T [μm] approximate to a stacked thickness [μm] (namely, L is 1 or more), where the stacked thickness is defined as a thickness of particles of the particulate substance as stacked in a close-packed structure, on the assumption that the particulate substance constituting the conductive fiber-coated particle is spherical. The stacked thickness [μm] is represented by [(√3/2)×L (number of stacked layers)+1]D [μm], namely, by (0.865L+1)D [μm], as illustrated in FIG. 2. FIG. 2 depicts a substrate 1 and a particulate substance 2. The present inventors have found that the molded article, when meeting the condition specified by Formula (I), may readily develop conductivity in the thickness direction even when it does not contain a large amount of the conductive fiber-coated particle. This indicates that the particulate substance in the conductive fiber-coated particle is liable to stack in the thickness direction to form a close-packed structure even when the molded articles does not contain a large amount of the conductive fiber-coated particle. The reason why this phenomenon occurs is unknown at this time.

The molded article according to the present invention preferably has anisotropic conductivity. Specifically, the molded article according to the present invention has a resistance in the thickness direction of preferably from 0.1Ω to 100 kΩ and particularly preferably from 0.1Ω to 10 kΩ. In contrast, the molded article according to the present invention may have a resistance in the in-plane direction (surface direction) of preferably 1 MΩ or more (e.g., from 1 MΩ to 100 TΩ) and particularly preferably 10 MΩ or more. The resistances of the molded article according to the present invention in the thickness and in-plane directions may be measured typically in conformity to JIS K6911.

The molded article according to the present invention is preferably transparent. Specifically, the molded article according to the present invention may have a total luminous transmittance not critical, but preferably 80% or more, more preferably 85% or more, and furthermore preferably 90% or more in the visible wavelength region, for a thickness of 0.1 mm. The total luminous transmittance of the molded article according to the present invention in the visible wavelength region may be measured typically in conformity to JIS K7361-1.

The molded article according to the present invention has transparency and conductivity (in particular, anisotropic conductivity) both at satisfactory levels and is usable as or in a transparent anisotropic conductive film (transparent anisotropic conductive film including the molded article according to the present invention). The transparent anisotropic conductive film may be obtained by forming the molded article according to the present invention on at least one surface of a transparent base film. Alternatively, the molded article according to the present invention may be used as the transparent anisotropic conductive film as intact or after further molding. The transparent anisotropic conductive film has transparency and anisotropic conductivity both at satisfactory levels as described above and is advantageously usable as a component (constituent material) for various electronic devices.

In an embodiment, the transparent anisotropic conductive film including the molded article according to the present invention is used for electrical coupling between two components, where at least one of the two components has microbumps. In this embodiment, the transparent anisotropic conductive film preferably contains the conductive fiber-coated particle as a highly flexible particle. This transparent anisotropic conductive film is preferred in this case among such transparent anisotropic conductive films each including the molded article according to the present invention. Typically, the transparent anisotropic conductive film containing the highly flexible conductive fiber-coated particle may be disposed between the two components with microbumps and subjected to thermocompression bonding to provide good electrical coupling between the two components.

Conductive Adhesive and Conductive Encapsulating Agent

The conductive adhesive and conductive encapsulating agent according to embodiments of the present invention each include the curable composition according to the present invention. The conductive adhesive according to the present invention, when used to bond transparent components with each other, can bring the two components into conduction therebetween without impairing transparency of the components. Likewise, the conductive encapsulating agent according to the present invention, when used to encapsulate a specific portion of a component, can bring a target area into conduction without impairing transparency of the portion.

In embodiments, the conductive adhesive and the conductive encapsulating agent according to the present invention each contain the conductive fiber-coated particle as a flexible particle. Particularly in these embodiments, the conductive adhesive and the conductive encapsulating agent, when applied to components with microbumps or a portion with microbumps, can bring them into conduction.

Conductive Structure

The conductive structure according to an embodiment of the present invention includes a first conductive substrate, a second conductive substrate, and the cured article according to the present invention disposed between the first and second conductive substrates. The first conductive substrate includes a bumped surface, and the bumped surface faces and is bonded to one surface of the second conductive substrate through the cured article. The second conductive substrate may include a bumped surface (includes bumps on its surface), or not.

The first and second conductive substrates are exemplified by metal substrates and conductive glass substrates and may be conductive substrates to constitute electronic devices. The electronic devices are exemplified by semiconductor devices such as diodes, transistors, ICs, CPUs, and memory devices; optical semiconductor devices; display devices such as liquid crystal panels, plasma display panels, and organic EL panels; high-density storage media such as magneto-optical disks; optical wiring (optical interconnections) such as optical waveguides; and solar cells.

The conductive structure according to the present invention may be produced typically through steps 1 and 2 as follows.

In the step 1, the curable composition or thin-film molded article according to the present invention is disposed between the bumped surface of the first conductive substrate and a surface of the second conductive substrate to form an assembly (laminate) including the first conductive substrate, the curable composition (or thin-film molded article), and the second conductive substrate in the specified sequence.

In the step 2, the assembly is irradiated with heat and/or an active energy ray to cure the curable composition, where the assembly includes the first conductive substrate, the curable composition (or thin-film molded article), and the second conductive substrate in the specified sequence.

The conductive fiber-coated particle to be contained in the curable composition or thin-film molded article for use in the step 1 is preferably highly flexible. This is because, the highly flexible conductive fiber-coated particle, when contained, conforms to and deforms along the bumped shape of the surface of the conductive substrate and extends even into fine portions of the shape between the first and second conductive substrates, and curing can be completed in this state. The resulting conductive structure has excellent conductive performance while preventing the formation of a poorly conducting portion (FIG. 3($a$)). In contrast, assume that a poorly flexible conductive fiber-coated particle is incorporated to form a curable composition, and the curable composition is used to give a conductive structure. In this case, the conductive structure, when applied to a first conductive substrate having a microbumped surface, may fail to allow the conductive fiber-coated particle to extend into fine portions, and this may cause partial poor conductivity (conduction failure) and may cause lower conductive performance (FIGS. 3($b$) and 3($c$)) of the conductive structure.

In the step 2, the assembly is preferably cured while pressurizing from outside toward inside, where the assembly includes the first conductive substrate, the curable composition (or thin-film molded article), and the second conductive substrate disposed in the specified sequence. The procedure is preferred so as to allow the conductive structure to exhibit still more excellent conductive performance. The pressurization may be performed typically by pressurizing using a pressing machine or pressurizing by the self-weight of the substrate. The weight bearing may be performed to an extent of typically 10 g/cm$^2$ or more and preferably from 10 to 100000 g/cm$^2$.

Electronic Device

The electronic device according to an embodiment of the present invention is formed using the curable composition according to the present invention. Specifically, the electronic device is formed using at least one selected from the group consisting of the conductive adhesive, the conductive encapsulating agent, and the thin-film molded article. The electronic device is exemplified by semiconductor devices such as diodes, transistors, ICs, CPUs, and memory devices; optical semiconductor devices; display devices such as liquid crystal panels, plasma display panels, and organic EL panels; high-density storage media such as magneto-optical disks; optical wiring (optical interconnections) such as optical waveguides; and solar cells. The cured article according to the present invention in the electronic device can develop excellent transparency and conductivity. In addition, the cured article according to the present invention contains the conductive fiber-coated particle that can be produced inexpensively. The electronic device according to the present invention therefore has high quality and productivity and is provided inexpensively.

EXAMPLES

The present invention will be illustrated in further detail with reference to several examples below. It should be noted, however, that the examples are by no means intended to limit the scope of the present invention.

Production Example 1

Silver Nanowire Production

Silver nanowires were produced according to a method described in "Materials Chemistry and Physics, vol. 114, pp. 333-338, "Preparation of Ag nanorods with high yield by polyol process"". Specifically, the production was performed by a procedure as follows.

An aliquot (0.5 mL) of a 6×10$^{-4}$ M FeCl$_3$ solution in ethylene glycol was added to 6 mL of ethylene glycol in a flask and heated to 150° C. The resulting solution as heated was combined with 6 mL of a solution mixture containing 0.052 M AgNO$_3$ and 0.067 M polyvinylpyrrolidone in ethylene glycol, where the solution mixture was added dropwise. The resulting reaction mixture was held at 150° C. for 1.5 hours to give a suspension. The suspension (10 mL) was diluted with 800 mL of a 1:1 (by weight) solvent mixture of ethanol and acetone, subjected to centrifugal separation (2000 rpm, 10 minutes) two times, and yielded a dispersion of silver nanowires. Part of the prepared dispersion was extracted, thermally dried, the content (percent by weight) of the silver nanowires in the dispersion was determined and found to be 2.9 percent by weight.

One hundred silver nanowires out of the prepared silver nanowires were subjected to measurements of diameter (thickness) and length using a scanning electron microscope (SEM). The measured diameters (thicknesses) and lengths were each arithmetically averaged. As a result, the silver nanowires were found to have an average diameter of 80 nm and an average length of 30 μm.

Example 1

Conductive Fiber-Coated Particle Production

An aliquot (0.3 part by weight) of fine plastic particles was mixed with and dispersed in 29.7 parts by weight of ethanol and yielded a fine plastic particle dispersion. The fine plastic particles were a product supplied under the trade name of Micropearl SP by Sekisui Chemical Co., Ltd. and having an average particle diameter of 8.5 μm. The fine plastic particle dispersion was mixed with 17.4 parts by weight (containing 0.5 part by weight of the silver nanowires) of the silver nanowire dispersion prepared in Production Example 1, from which the solvents were removed by heating with stirring at 70° C. for 30 minutes, and yielded conductive fiber-coated particles A.

The fine plastic particles had a surface area of 226.9 μm$^2$ per particle, and the silver nanowires had a projected area of 2.4 μm$^2$ per nanowire. The fine plastic particles and the silver nanowires were used respectively in amounts of 0.3 part by weight and 0.5 part by weight. This indicates that twenty silver nanowires were adsorbed by one fine plastic particle. Based on this, the ratio of the surface area (total surface area) of the fine plastic particles to the projected area (total projected area) of the silver nanowires is calculated to be about 100:21.

Conductive Fiber-Coated Particle SEM Observation

The prepared conductive fiber-coated particles A were observed with a scanning electron microscope (SEM) at 100000-fold magnification. The result demonstrated that the silver nanowires were adsorbed on the fine plastic particles (the fine plastic particles were coated with the silver nanowires), as indicated in FIG. 1.

Conductive Fiber-Coated Particle Conductivity Evaluation

The prepared conductive fiber-coated particles A were disposed between a pair of conductive glass substrates (supplied by Luminescence Technology Corporation, having a size of 25 mm by 25 mm, including a 0.14-μm thick ITO film). An electric resistance of the resulting article was measured using a digital tester and found to be 150Ω. The resistance of the conductive fiber-coated particles was estimated at about 50Ω by subtracting the resistance of the ITO from the measured resistance.

Example 2

Curable Composition Preparation

An aliquot (0.3 part by weight) of fine plastic particles was mixed with and dispersed in 29.7 parts by weight of ethanol and yielded a fine plastic particle dispersion. The fine plastic particles were a product supplied under trade name of Micropearl SP by Sekisui Chemical Co., Ltd. and having an average particle diameter of 8.5 μm. The fine plastic particle dispersion was mixed with 17.4 parts by weight of the silver nanowire dispersion (containing 0.5 part by weight of the silver nanowires) prepared in Production Example 1 to give a mixture.

Next, 47.4 parts by weight of the above-prepared mixture was mixed with 40 parts by weight of (3,4,3',4'-diepoxy) bicyclohexyl and 60 parts by weight of CELLOXIDE 2021P (trade name, a thermosetting epoxy compound, supplied by Daicel Corporation). The resulting mixture was heated with stirring at 70° C. for 30 minutes to remove the solvents (ethanol and acetone) therefrom, was combined with 0.5 part by weight of San-Aid SI-B3 (trade name, a thermal initiator, supplied by SANSHIN CHEMICAL INDUSTRY CO., LTD.), and yielded a curable composition (A-1).

Example 3

Cured Article Preparation

The curable composition (A-1) prepared in Example 2 was disposed between a pair of conductive glass substrates, subjected to a heat treatment in a nitrogen atmosphere at 100° C. for one hour, and yielded a cured article 1 having a film thickness of 8.5 μm. This was used as a specimen for the measurement of conductivity in the thickness direction. The conductive glass substrates were each a product supplied by Luminescence Technology Corporation, having a size of 25 mm by 25 mm, and including a 0.14-μm thick ITO film.

The prepared cured article 1 was observed with a CCD at 1000-fold magnification. FIGS. 4(a) and 4(b) depict observed CCD images of the cured article 1 respectively in a through mode and in a reflection mode.

Separately, the above procedure was performed, except for using, instead of the conductive glass substrates, a pair of quartz glass substrates each including quartz glass and, at both ends thereof, aluminum electrodes, and yielded a cured article 1 having a film thickness of 8.5 μm. This was used as a specimen for the measurement of conductivity in the in-plane direction.

The cured articles 1 prepared in Example 3 met the condition specified by Formula (I).

The specimen for the evaluation of conductivity in the thickness direction prepared in Example 3 was used to measure an electric resistance of the cured article in the thickness direction using a two-probe tester. Likewise, the specimen for the evaluation of conductivity in the in-plane direction prepared in Example 3 was used to measure an electric resistance of the cured article in the in-plane direction using a two-probe tester. The results are indicated in Table 1.

[Table 1]

TABLE 1

|  | Cured article film thickness (μm) | Resistance in in-plane direction (Ω) | Resistance in thickness direction (Ω) |
|---|---|---|---|
| Example 3 | 8.5 | $1 \times 10^{12}$ | $2 \times 10^1$ |

Example 4

Curable Composition Preparation

A curable composition (A-2) was prepared by the procedure of Example 2, except for using the fine plastic particles in an amount of 0.5 part by weight instead of 0.3 part by weight. The fine plastic particles were a product supplied under the trade name of Micropearl SP by Sekisui Chemical Co., Ltd. and having an average particle diameter of 8.5 μm.

Example 5

Cured Article Preparation

A cured article 2 having a film thickness of 8.5 μm was prepared by the procedure of Example 3, except for using the curable composition (A-2) prepared in Example 4 as the curable composition.

The prepared cured article 2 was observed with a CCD at 1000-fold magnification. FIGS. 5(a) and 5(b) depict observed CCD images of the cured article 2 respectively in a through mode and in a reflection mode.

Example 6

Cured Article Preparation

A cured article 3 having a film thickness of 22 μm was prepared by the procedure of Example 3, except for using a 22-μm thick poly(vinylidene chloride) spacer in disposing of the curable composition (A-2) prepared in Example 4 between the pair of conductive glass substrates so as to adjust the thickness (distance) between the conductive glass substrates at 22 μm.

Example 7

Curable Composition Preparation

A curable composition (A-3) (containing 1 percent by volume of conductive fiber-coated particles) was prepared by the procedure of Example 2, except for using the fine plastic particles in an amount of 50 parts by weight instead of 0.3 part by weight, and using the silver nanowires in an amount of 5 parts by weight instead of 0.5 part by weight. The fine plastic particles were a product supplied under the trade name of Micropearl SP by Sekisui Chemical Co., Ltd. and having an average particle diameter of 8.5 μm.

Example 8

Cured Article Preparation

A cured article 4 having a film thickness of 8.5 μm was prepared by the procedure of Example 3, except for using the curable composition (A-3) prepared in Example 7 as the curable composition. This was used as a specimen for the measurement of conductivity in the thickness direction.

Separately, another cured article 4 having a film thickness of 8.5 μm was prepared by the above procedure, except for using, instead of the conductive glass substrates, quartz glass substrates each including quartz glass and, at both ends thereof, aluminum electrodes. This was used as a specimen for the measurement of conductivity in the in-plane direction.

Example 9

Curable Composition Adjustment

A mixture was prepared by the procedure of Example 2, except for using fine silica particles, instead of the fine plastic particles, and using a dispersion of the fine silica particles and the silver nanowire dispersion in weights 90 times the weights in Example 2. The fine silica particles were a product supplied under the trade name of Micropearl SI by Sekisui Chemical Co., Ltd. and having an average particle diameter of 8.5 μm.

Next, the above-prepared mixture was filtrated under reduced pressure to remove the solvents (ethanol and acetone), dried by heating at 80° C. for 5 minutes, and yielded conductive fiber-coated particles B.

An aliquot (0.8 part by weight) of the above-prepared conductive fiber-coated particles B was mixed with 40 parts by weight of (3,4,3',4'-diepoxy)bicyclohexyl and 60 parts by weight of CELLOXIDE 2021P, stirred for 30 minutes, further combined with 0.5 part by weight of San-Aid SI-B3, and yielded a curable composition (B-1).

Example 10

A cured article 5 having a film thickness of 8.5 μm was prepared by the procedure of Example 3, except for using the curable composition (B-1) prepared in Example 9 as the curable composition.

The prepared cured article 5 was observed with a CCD and found not to suffer from aggregation therein.

Example 11

Conductive Fiber-Coated Particle Production

An aliquot (0.15 part by weight) of fine crosslinked alkyl acrylate copolymer particles was mixed with and dispersed in ethanol (14.85 parts by weight) and yielded a fine particle dispersion. The fine crosslinked alkyl acrylate copolymer particles were a product supplied under the trade name of TECHPOLYMER AFX Series by Sekisui Plastics Co., Ltd. and having a 10% compressive strength of 0.55 kgf/mm², an average particle diameter of 7.7 μm, and a refractive index of 1.49. The fine particle dispersion was mixed with 5.22 parts by weight of the silver nanowire dispersion (containing 0.15 parts by weight of the silver nanowires) prepared in Production Example 1, filtrated to remove the solvents therefrom, and yielded conductive fiber-coated particles C. The prepared conductive fiber-coated particles C were observed with a scanning electron microscope (SEM) and were found that the silver nanowires were adsorbed on the fine plastic particles (the fine plastic particles were coated with the silver nanowires).

Example 12

Curable Composition Preparation

An aliquot (1.0 part by weight) of the conductive fiber-coated particles C prepared in Example 11 was mixed with 60 parts by weight of (3,4,3',4'-diepoxy)bicyclohexyl and 40 parts by weight of CELLOXIDE 2021P (trade name, a thermosetting epoxy compound, supplied by Daicel Corporation), combined with 0.5 part by weight of San-Aid SI-B3 (trade name, a thermal initiator, supplied by SANSHIN CHEMICAL INDUSTRY CO., LTD.) and yielded a curable composition (C-1).

Example 13

Cured Article Preparation

The curable composition (C-1) prepared in Example 12 was disposed between a pair of conductive glass substrates, subjected to a heat treatment at 100° C. for one hour with weight bearing, and yielded four different cured articles 6 to 9 respectively having different film thicknesses of 14 μm, 10 μm, 9 μm, and 7 μm. The conductive glass substrates were each a product supplied by Luminescence Technology Corporation, having a size of 25 mm by 25 mm, and including a 0.14-μm thick ITO film. The weight bearing was performed at 24 g/cm$^2$, 38 g/cm$^2$, 48 g/cm$^2$, and 57 g/cm$^2$ respectively to give the cured articles having film thicknesses of 14 μm, 10 μm, 9 μm, and 7 μm.

The prepared cured article 6 was observed with a CCD at 1000-fold magnification. FIG. 6 depicts an observed CCD image of the cured article 6, demonstrating that the conductive fiber-coated particles C were deformed by the weight bearing upon curing.

Example 14

Cured Article Preparation

The curable composition (C-1) prepared in Example 12 was disposed between first and second conductive glass substrates, subjected to a heat treatment at 100° C. for one hour with weight bearing of 28 g/cm$^2$, and yielded a cured article 10 having a film thickness of 13 μm. The first conductive substrate had a bump (difference in level) of 5 μm in depth (height), had a size of 25 mm by 25 mm, and included a 0.14-μm thick ITO film. The second conductive glass substrate was a product supplied by Luminescence Technology Corporation, having a size of 25 mm by 25 mm, and including a 0.14-μm thick ITO film.

Example 15

Conductive Fiber-Coated Particle Production

Conductive fiber-coated particles D were prepared by the procedure of Example 11, except for using, instead of the fine crosslinked alkyl acrylate copolymer particles, fine ethylene-methyl methacrylate copolymer particles (trade name SOFT BEADS, supplied by Sumitomo Seika Chemicals Co., Ltd., having a melting temperature of 100° C., a 10% compressive strength of 0.3 kgf/mm$^2$, and an average particle diameter of 11 μm).

Example 16

Curable Composition Preparation

A curable composition (D-1) was prepared by the procedure of Example 12, except for using 1.0 part by weight of the conductive fiber-coated particles D prepared in Example 15, instead of 1.0 part by weight of the conductive fiber-coated particles C prepared in Example 11.

Example 17

Cured Article Preparation

The curable composition (D-1) prepared in Example 16 was disposed between a pair of conductive glass substrates, subjected to a heat treatment at 100° C. for one hour with weight bearing of 30 g/cm$^2$, and yielded a cured article 11 having a film thickness of 10 μm. The conductive glass substrates were each a product supplied by Luminescence Technology Corporation, having a size of 25 mm by 25 mm, and including a 0.14-μm thick ITO film.

The prepared cured article 11 was observed with a CCD at 500-fold magnification. FIG. 7 depicts an observed CCD image (in a through mode) of the cured article 11. The image indicates that the conductive fiber-coated particles had amorphous outlines, demonstrating that the conductive fiber-coated particles were melted upon the heat treatment.

Example 18

Curable Composition Preparation

A curable composition (A-4) (containing 1.2 percent by weight of conductive fiber-coated particles) was prepared by the procedure of Example 2, except for mixing the fine plastic particles in an amount of 0.85 parts by weight, instead of 0.3 part by weight, with 17.4 parts by weight of the silver nanowire dispersion (containing 0.15 part by weight of the silver nanowires). The fine plastic particles were a product supplied under the trade name of Micropearl SP by Sekisui Chemical Co., Ltd. and having an average particle diameter of 8.5 μm.

Example 19

Cured Article Preparation

A cured article 12 having a film thickness of 8.5 μm was prepared by the procedure of Example 3, except for using the curable composition (A-4) prepared in Example 18 as the curable composition.

Cured Article Conductivity Evaluation 1

The cured articles prepared in the examples were subjected to the measurement of a volume resistivity (i.e., electric resistance in the thickness direction) using a digital tester or electrometer (supplied by Keithley Instruments Inc.). The cured article 4 prepared in Example 8 was also subjected to the measurement of an electric resistance in the in-plane direction. Results are indicated in Table 2.

Cured Article Transparency Evaluation

The cured articles prepared in the examples were subjected to the measurement of total luminous transmittance (value of the entire specimen including the pair of conductive glass substrates) in the visible wavelength region using a UV/Vis Spectrophotometer (trade name V-650DS, supplied by JASCO Corporation). For the cured article 4 prepared in Example 8, the specimen including the conductive glass substrates was subjected to the measurement of total luminous transmittance. Results are indicated in Table 2 and FIG. 8. FIG. 8 demonstrates that the change in film thickness little affected the volume resistivity in the cured articles according to the present invention.

[Table 2]

TABLE 2

|  | Cured article | Average particle diameter of particulate substance (μm) | Film thickness of cured article (μm) | Volume resistivity (Ω · cm) | Total luminous transmittance (%) |
|---|---|---|---|---|---|
| Example 3 | Cured article 1 | 8.5 | 8.5 | $4 \times 10^2$ | 95 |
| Example 5 | Cured article 2 | 8.5 | 8.5 | $7 \times 10^2$ | >94 |
| Example 6 | Cured article 3 | 8.5 | 22 | $1 \times 10^4$ | >93 |
| Example 8 | Cured article 4 | 8.5 | 8.5 | $4 \times 10^2$ (thickness direction) $1 \times 10^3$ (in-plane direction) | >89 |
| Example 13 | Cured article 6 | 7.7 | 14 | $2.30 \times 10^5$ | 92 |
|  | Cured article 7 | 7.7 | 10 | $2.90 \times 10^5$ | 94 |
|  | Cured article 8 | 7.7 | 9 | $3.00 \times 10^5$ | 94 |
|  | Cured article 9 | 7.7 | 7 | $3.30 \times 10^5$ | 94 |
| Example 14 | Cured article 10 | 7.7 | 13 | $3.00 \times 10^5$ | - |
| Example 17 | Cured article 11 | 11 | 10 | $2.50 \times 10^5$ | 93 |
| Example 19 | Cured article 12 | 8.5 | 8.5 | $3.00 \times 10^3$ | 94 |

As is indicated in Table 2, the cured articles according to the present invention had high transparency and offered excellent conductivity in the thickness direction. The cured article 4 offered excellent conductivity also in the in-plane direction. The cured article, when containing flexible conductive fiber-coated particles, exhibited excellent conductive performance without the formation of a poorly conducting portion even when applied to a microbumped shape.

INDUSTRIAL APPLICABILITY

The conductive fiber-coated particles according to the present invention can be produced by a simple process without the use of a special apparatus and, even when used in a small amount, can impart excellent conductivity (in particular, conductivity in the thickness direction) to a cured article. The conductive fiber-coated particles, when incorporated to form a transparent cured article, can impart excellent conductivity (in particular, conductivity in the thickness direction) to the cured article while maintaining transparency of the cured article.

REFERENCE SIGNS LIST 1 substrate
1-1 first conductive substrate
1-2 second conductive substrate
2 particulate substance
3 conductive fiber-coated particle
4 cured article
5 good conductivity
6 poor conductivity

The invention claimed is:

1. A conductive fiber-coated particle comprising:
a particulate substance; and
a fibrous conductive substance,
the particulate substance being coated with the fibrous conductive substance,
wherein the fibrous conductive substance comprises a conductive nanowire,
wherein the conductive nanowire comprises at least one metal nanowire,
wherein the conductive nanowire comprises a silver nanowire as the metal nanowire,
wherein the fibrous conductive substance has an average diameter of from 1 to 400 nm and an average length of from 1 to 100 μm, and
wherein the conductive fiber-coated particle is produced by mixing the particulate substance with the fibrous conductive substance in a solvent,
wherein the particulate substance has an average particle diameter of from 1 to 100 μm, and
wherein upon mixing of the particulate substance with the conductive fiber in the solvent, a ratio between the particulate substance and the conductive fiber is such that the ratio [surface area:projected area] of the surface area of the particulate substance to the projected area of the conductive fiber is from 100:1 to 100:100.

2. The conductive fiber-coated particle according to claim 1, wherein the particulate substance comprises a globular or rod-like particulate substance.

3. The conductive fiber-coated particle according to claim 1, wherein the particulate substance has a 10% compressive strength of 3 kgf/mm² or less.

4. A curable composition comprising:
the conductive fiber-coated particle according to claim 1; and
a curable compound.

5. The curable composition according to claim 4, further comprising
a conductive substance other than the conductive fiber-coated particle.

6. The curable composition according to claim 5,
wherein the conductive substance other than the conductive fiber-coated particle comprises a fibrous conductive substance.

7. The curable composition according to claim 5,
wherein the curable composition comprises the conductive substance other than the conductive fiber-coated particle in a content of from 0 to 10 parts by weight per 100 parts by weight of the conductive fiber-coated particle.

8. The curable composition according to claim 4,
wherein the curable composition is curable by the application of at least one of an active energy ray and heat to give a cured article.

9. The curable composition according to claim 8,
wherein the particulate substance in the conductive fiber-coated particle comprises a thermoplastic resin having a melting point equal to or lower than a curing temperature of the curable compound, and
wherein the curable composition is curable by heating to give a cured article.

10. The curable composition according to claim 4,
wherein the curable composition comprises the conductive fiber-coated particle in an amount of from 0.01 to 30 parts by weight per 100 parts by weight of the curable compound.

11. The curable composition according to claim 4,
wherein the curable composition comprises the particulate substance in an amount of from 0.09 to 6 parts by weight per 100 parts by weight of the curable compound.

12. The curable composition according to claim 4,
wherein the curable composition comprises the fibrous conductive substance in an amount of from 0.01 to 1.0 part by weight per 100 parts by weight of the curable compound.

13. The curable composition according to claim 4,
wherein a difference in refractive index between the particulate substance and the curable compound is 10% or less of the refractive index of the curable compound.

14. A conductive adhesive comprising
the curable composition according to claim 4.

15. A conductive encapsulating agent comprising
the curable composition according to claim 4.

16. A cured article derived from the curable composition according to claim 4.

17. The cured article according to claim 16,
wherein the cured article has a total luminous transmittance for a thickness of 0.1 mm of 80% or more in a visible wavelength region.

18. A thin-film molded article comprising
the cured article according to claim 16.

19. The thin-film molded article according to claim 18,
wherein the particulate substance constituting the conductive fiber-coated particle in the curable composition to form the cured article has an average particle diameter D [μm],
wherein the molded article has a thickness T [μm], and
wherein D and T meet a condition specified by Formula (I):

$$(0.865L+1)D-0.3D \leq T \leq (0.865L+1)D+0.3D \quad (I)$$

wherein L represents an integer of 0 or more.

20. The thin-film molded article according to claim 19,
wherein the thin-film molded article has a resistance of from 0.1Ω to 100 kΩ in a thickness direction and a resistance of from 1 MΩ or more in an in-plane direction.

21. A transparent anisotropic conductive film comprising the molded article according to claim 18.

22. A conductive structure comprising:
a first conductive substrate;
a second conductive substrate; and
the cured article according to claim 16 disposed between the first and second conductive substrates,
the first conductive substrate comprising
a bumped surface facing and being bonded to one surface of the second conductive substrate through the cured article.

23. An electronic device prepared with at least one selected from the group consisting of:
(i) a conductive adhesive comprising a curable composition
comprising a curable compound and a conductive fiber-coated particle comprising:
a particulate substance, and
a fibrous conductive substance,
the particulate substance being coated with the fibrous conductive substance,
wherein the fibrous conductive substance comprises a conductive nanowire,
wherein the conductive nanowire comprises at least one metal nanowire,
wherein the conductive nanowire comprises a silver nanowire as the metal nanowire,
wherein the fibrous conductive substance has an average diameter of from 1 to 400 nm and an average length of from 1 to 100 μm, and
wherein the conductive fiber-coated particle is produced by mixing the particulate substance with the fibrous conductive substance in a solvent,
wherein the particulate substance has an average particle diameter of from 1 to 100 μm, and
wherein upon mixing of the particulate substance with the conductive fiber in the solvent, a ratio between the particulate substance and the conductive fiber is such that the ratio [surface area:projected area] of the surface area of the particulate substance to the projected area of the conductive fiber is from 100:1 to 100:100;
(ii) a conductive encapsulating agent comprising a curable composition
comprising a curable compound and a conductive fiber-coated particle comprising:
a particulate substance, and
a fibrous conductive substance,
the particulate substance being coated with the fibrous conductive substance,
wherein the fibrous conductive substance comprises a conductive nanowire,
wherein the conductive nanowire comprises at least one metal nanowire,
wherein the conductive nanowire comprises a silver nanowire as the metal nanowire,
wherein the fibrous conductive substance has an average diameter of from 1 to 400 nm and an average length of from 1 to 100 μm, and
wherein the conductive fiber-coated particle is produced by mixing the particulate substance with the fibrous conductive substance in a solvent,
wherein the particulate substance has an average particle diameter of from 1 to 100 μm, and
wherein upon mixing of the particulate substance with the conductive fiber in the solvent,
a ratio between the particulate substance and the conductive fiber is such that the ratio
[surface area:projected area] of the surface area of the particulate substance to the projected area
of the conductive fiber is from 100:1 to 100:100; and
(iii) the thin-film molded article according to claim 18.

24. The conductive fiber-coated particle according to claim 1,
wherein the particulate substance has an average particle diameter of from 5 to 30 μm,
wherein upon mixing of the particulate substance with the conductive fiber in the solvent, a ratio between the particulate substance and the conductive fiber is such that the ratio [surface area:projected area] of the surface area of the particulate substance to the projected area of the conductive fiber is from 100:10 to 100:50, and
wherein the particulate substance is transparent plastics or silica.

25. A method for producing the curable composition according to claim 4, the method comprising the step of mixing the conductive fiber-coated particle with the curable compound.

26. The method according to claim 25,
wherein the conductive fiber-coated particle to be mixed with the curable compound is prepared through the steps of:
A) mixing the particulate substance with the fibrous conductive substance in a solvent to give a dispersion of the conductive fiber-coated particle; and
B) removing the solvent from the dispersion of the conductive fiber-coated particle prepared in the step A) to give the conductive fiber-coated particle.

27. A method for producing a conductive fiber-coated particle, the conductive fiber-coated particle comprising:
a fibrous conductive substance; and
a particulate substance coated with the fibrous conductive substance,
the method comprising the step of
mixing the particulate substance with the fibrous conductive substance in a solvent,
wherein the fibrous conductive substance comprises a conductive nanowire, and
wherein the conductive nanowire comprises at least one metal nanowire, and
wherein the conductive nanowire comprises a silver nanowire as the metal nanowire,
wherein the fibrous conductive substance has an average diameter of from 1 to 400 nm and an average length of from 1 to 100 µm,
wherein the particulate substance has an average particle diameter of from 1 to 100 µm, and
wherein upon mixing of the particulate substance with the conductive fiber in the solvent, a ratio between the particulate substance and the conductive fiber is such that the ratio [surface area:projected area] of the surface area of the particulate substance to the projected area of the conductive fiber is from 100:1 to 100:100.

28. The method for producing the conductive fiber-coated particle according to claim 27,
wherein the particulate substance has an average particle diameter of from 5 to 30 µm,
wherein upon mixing of the particulate substance with the conductive fiber in the solvent, the ratio between the particulate substance and the conductive fiber is such that the ratio [surface area:projected area] of the surface area of the particulate substance to the projected area of the conductive fiber is from 100:10 to 100:50, and
wherein the particulate substance is transparent plastics or silica.

* * * * *